United States Patent [19]

Kobayashi et al.

[11] Patent Number: 4,922,432

[45] Date of Patent: May 1, 1990

[54] KNOWLEDGE BASED METHOD AND APPARATUS FOR DESIGNING INTEGRATED CIRCUITS USING FUNCTIONAL SPECIFICATIONS

[75] Inventors: Hideaki Kobayashi, Columbia, S.C.; Masahiro Shindo, Osaka, Japan

[73] Assignees: International Chip Corporation, Columbia, S.C.; Ricoh Company, Ltd., Tokyo, Japan

[21] Appl. No.: 143,821

[22] Filed: Jan. 13, 1988

[51] Int. Cl.[5] .............................................. G06F 15/60

[52] U.S. Cl. .................................... 364/490; 364/489; 364/488; 364/521

[58] Field of Search ................................ 364/488–491, 364/521, 300, 513

[56] References Cited

U.S. PATENT DOCUMENTS

| | | | |
|---|---|---|---|
| 4,635,208 | 1/1987 | Coleby et al. | 364/491 |
| 4,638,442 | 1/1987 | Bryant et al. | 364/489 |
| 4,648,044 | 3/1987 | Hardy et al. | 364/513 |
| 4,651,284 | 3/1987 | Watanabe et al. | 364/491 |
| 4,656,603 | 4/1987 | Dunn | 364/488 |
| 4,658,370 | 4/1987 | Erman et al. | 364/513 |
| 4,675,829 | 6/1987 | Clemenson | 364/513 |
| 4,700,317 | 10/1987 | Watanabe et al. | 364/521 |
| 4,703,435 | 10/1987 | Darringer et al. | 364/488 |
| 4,803,636 | 2/1989 | Nishiyama et al. | 364/491 |

FOREIGN PATENT DOCUMENTS

| | | | |
|---|---|---|---|
| 1445914 | 8/1976 | United Kingdom | 364/490 |

OTHER PUBLICATIONS

"Verifying Compiled Silicon", by E. K. cheng, VLSI Design, Oct. 1984, pp. 1–4.

"CAD System for IC Design", by M. E. Daniel et al., IEEE Trans. on Computer-Aided Design of Integrated Circuits & Systems, vol. CAD-1, No. 1, Jan. 1982, pp. 2–12.

"An Overview of Logic Synthesis System", by L. Trevillyan, 24th ACM/IEEE Design Automation Conference, 1978, pp. 166–172.

"Methods Used in an Automatic Logic Design Generator", by T. D. Friedman et al., IEEE Trans. on Computers, vol. C-18, No. 7, Jul. 1969, pp. 593–613.

"Experiments in Logic Synthesis", by J. A. Darringer, IEEE ICCC, 1980.

"A Front End Graphic Interface to First Silicon Compiler", by J. H. Nash, EDA 84, Mar. 1984.

"quality of Designs from An Automatic Logic Generator", by T. D. Friedman et al., IEEE 7th DA Conference, 1970, pp. 71–89.

"A New Look at Logic Synthesis", by J. A. Darringer et al., IEEE 17th D. A. Conference 1980, pp. 543–548.

Trevillyan—Trickey, H., Flamel: *A High Level Hardward Compiler,* IEEE Transactions On Computer Aided Design, Mar. 1987, pp. 259–269.

Parker et al., The *CMU Design Automation System—An Example of Automated Data Path Design,* Proceedings Of The 16th Design Automation Conference, Las Vegas, Nev., 1979, pp. 73–80.

*An Engineering Approach to Digital Design,* William I. Fletcher, Prentice-Hall, Inc., pp. 491–505.

*Primary Examiner*—Felix D. Gruber

*Assistant Examiner*—V. N. Trans

*Attorney, Agent, or Firm*—Bell, Seltzer, Park & Gibson

[57] ABSTRACT

The present invention provides a computer-aided design system and method for designing an application specific integrated circuit which enables a user to define functional architecture independent specifications for the integrated circuit and which translates the functional architecture independent specifications into the detailed information needed for directly producing the integrated circuit. The functional architecture independent specifications of the desired integrated circuit can be defined at the functional architecture independent level in a flowchart format. From the flowchart, the system and method uses artificial intelligence and expert systems technology to generate a system controller, to select the necessary integrated circuit hardware cells needed to achieve the functional specifications, and to generate data and control paths for operation of the integrated circuit. This list of hardware cells and their interconnection requirements is set forth in a netlist. From the netlist it is possible using known manual techniques or existing VLSI CAD layout systems to generate the detailed chip level topological information (mask data) required to produce the particular application specific integrated circuit.

20 Claims, 12 Drawing Sheets

FUNCTIONAL LEVEL

STRUCTURAL LEVEL

PHYSICAL LAYOUT LEVEL

KNOWLEDGE BASED METHOD AND APPARATUS FOR DESIGNING INTEGRATED CIRCUITS USING FUNCTIONAL SPECIFICATIONS

FIELD AND BACKGROUND OF THE INVENTION

This invention relates to the design of integrated circuits, and more particularly relates to a computer-aided method and apparatus for designing integrated circuits.

An application specific integrated circuit (ASIC) is an integrated circuit chip designed to perform a specific function, as distinguished from standard, general purpose integrated circuit chips, such as microprocessors, memory chips, etc. A highly skilled design engineer having specialized knowledge in VLSI circuit design is ordinarily required to design a ASIC. In the design process, the VLSI design engineer will consider the particular objectives to be accomplished and tasks to be performed by the integrated circuit and will create structural level design specifications which define the various hardware components required to perform the desired function, as well as the interconnection requirements between these components. A system controller must also be designed for synchronizing the operations of these components. This requires an extensive and all encompassing knowledge of the various hardware components required to achieve the desired objectives, as well as their interconnection requirements, signal level compatibility, timing compatibility, physical layout, etc. At each design step, the designer must do tedious analysis. The design specifications created by the VLSI design engineer may, for example, be in the form of circuit schematics, parameters or specialized hardware description languages (HDLs).

From the structural level design specifications, the description of the hardware components and interconnections is converted to a physical chip layout level description which describes the actual topological characteristics of the integrated circuit chip. This physical chip layout level description provides the mask data needed for fabricating the chip.

Due to the tremendous advances in very large scale integration (VLSI) technology, highly complex circuit systems are being built on a single chip. With their complexity and the demand to design custom chips at a faster rate, in large quantities, and for an ever increasing number of specific applications, computer-aided design (CAD) techniques need to be used. CAD techniques have been used with success in design and verification of integrated circuits, at both the structural level and at the physical layout level. For example, CAD systems have been developed for assisting in converting VLSI structural level descriptions of integrated circuits into the physical layout level topological mask data required for actually producing the chip. Although the presently available computer-aided design systems greatly facilitate the design process, the current practice still requires highly skilled VLSI design engineers to create the necessary structural level hardware descriptions.

There is only a small number of VLSI designers who possess the highly specialized skills needed to create structural level integrated circuit hardware descriptions. Even with the assistance of available VLSI CAD tools, the design process is time consuming and the probability of error is also high because of human involvements. There is a very significant need for a better and more cost effective way to design custom integrated circuits.

SUMMARY OF THE INVENTION

In accordance with the present invention a CAD (computer-aided design) system and method is provided which enables a user to define the functional requirements for a desired target integrated circuit, using an easily understood functional architecture independent level representation, and which generates therefrom the detailed information needed for directly producing an application specific integrated circuit (ASIC) to carry out those specific functions. Thus, the present invention, for the first time, opens the possibility for the design and production of ASICs by designers, engineers and technicians who may not possess the specialized expert knowledge of a highly skilled VLSI design engineer.

The functional architecture independent specifications of the desired ASIC can be defined in a suitable manner, such as in list form or preferably in a flowchart format. The flowchart is a highly effective means of describing a sequence of logical operations, and is well understood by software and hardware designers of varying levels of expertise and training. From the flowchart (or other functional specifications), the system and method of the present invention translates the functional architecture independent specifications into structural an architecture specific level definition of an integrated circuit, which can be used directly to produce the ASIC. The structural level definition includes a list of the integrated circuit hardware cells needed to achieve the functional specifications. These cells are selected from a cell library of previously designed hardware cells of various functions and technical specifications. The system also generates data paths among the selected hardware cells. In addition, the present invention generates a system controller and control paths for the selected integrated circuit hardware cells. The list of hardware cells and their interconnection requirements may be represented in the form of a netlist. From the netlist it is possible using either known manual techniques or existing VLSI CAD layout systems to generate the detailed chip level geometrical information (e.g. mask data) required to produce the particular application specific integrated circuit in chip form.

The preferred embodiment of the system and method of the present invention which is described more fully hereinafter is referred to as a Knowledge Based Silicon Compiler (KBSC). The KBSC is an ASIC design methodology based upon artificial intelligence and expert systems technology. The user interface of KBSC is a flowchart editor which allows the designer to represent VLSI systems in the form of a flowchart. The KBSC utilizes a knowledge based expert system, with a knowledge base extracted from expert ASIC designers with a high level of expertise in VLSI design to generate from the flowchart a netlist which describes the selected hardware cells and their interconnection requirements.

BRIEF DESCRIPTION OF THE DRAWINGS

The invention will be better understood by reference to the detailed description which follows, taken in connection with the accompanying drawings, in which.

DETAILED DESCRIPTION OF ILLUSTRATIVE EMBODIMENTS

Figure 1A:
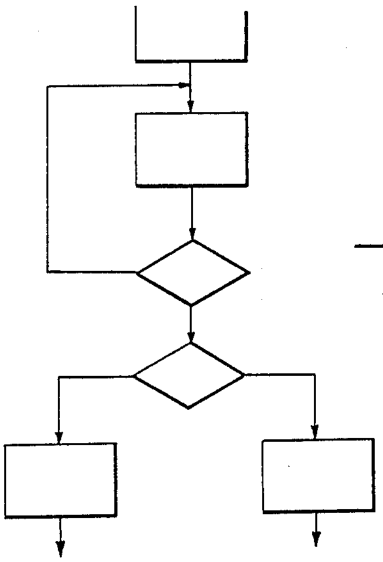
FIG. 1*a* illustrates a functional level design representation of a portion of a desired target circuit, shown in the form of a flowchart.
Figure 1B:
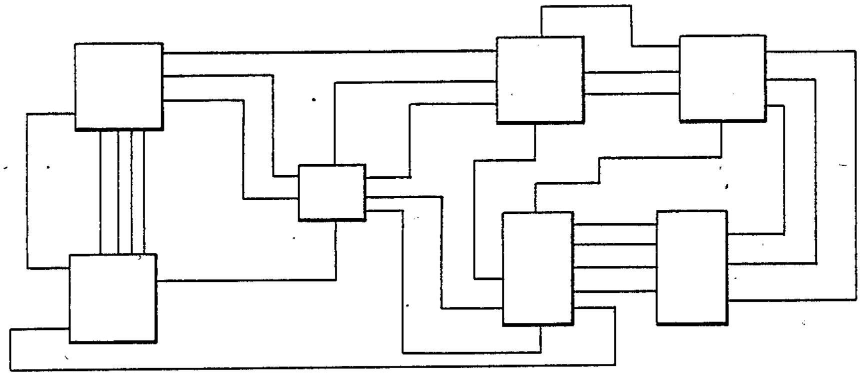
FIG. 1*b* illustrates a structural level design representation of an integrated circuit.
Figure 1C:
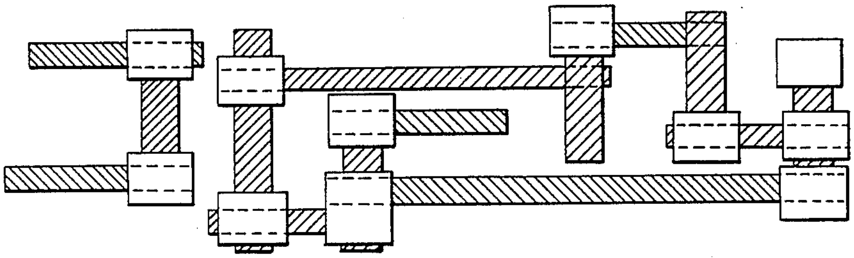
FIG. 1*c* illustrates a design representation of a circuit at a physical layout level, such as would be utilized in the fabrication of an integrated circuit chip.

FIGS. 1*a*, 1*b* and 1*c* illustrate three different levels of representing the design of an integrated circuit. FIG. 1*a* shows a functional (or behavioral) representation architecture independent in the form of a flowchart. A flowchart is a graphic representation of an algorithm and consists of two kinds of blocks or states, namely actions and conditions (decisions). Actions are conventionally represented in the flowchart by a rectangle or box, and conditions are represented by a diamond. Transitions between actions and conditions are represented by lines with arrows. FIG. 1*b* illustrates a structural (or logic) level representation of an integrated circuit. In this representation, blocks are used to represent integrated architecture specific circuit hardware components for performing various functions, and the lines interconnecting the blocks represent paths for the flow of data or control signals between the blocks. The blocks may, for example, represent hardware components such as adders, comparators, registers, system controllers, etc. FIG. 1*c* illustrates a physical layout level representation of an integrated circuit design, which provides the detailed mask data necessary to actually manufacture the devices and conductors which together comprise integrated circuit.

As noted earlier, the design of an integrated circuit at the structural level requires a design engineer with highly specialized skills and expertise in VLSI design. In the KBSC system of the present invention, however, integrated circuits can be designed at a functional level because the expertise in VLSI design is provided and applied by the invention. Allowing the designer to work with flowcharts instead of logic circuit schematics simplifies the task of designing custom integrated circuits, making it quicker, less expensive and more reliable. The designer deals with an algorithm using simple flowcharts at an architecture independent functional (behavioral) level, and needs to know only the necessary logical steps to complete a task, rather than the specific means for accomplishing the task. Designing with flowcharts requires less work in testing because flowcharts allow the designer to work much closer to the algorithm. On the other hand, previously existing VLSI design tools require the designer to represent an algorithm with complex circuit schematics at a structural level, therefore requiring more work in testing. Circuit schematics make it harder for the designer to cope with the algorithm function which needs to be incorporated into the target design because they intermix the hardware and functional considerations. Using flowcharts to design custom integrated circuits will allow a large number of system designers to access VLSI technology, where previously only a small number of designers had the knowledge and skills to create the necessary structural level hardware descriptions.

Figure 2:
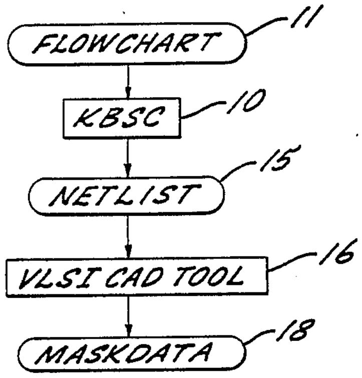
FIG. 2 is a block schematic diagram showing how integrated circuit mask data is created from flowchart descriptions by the KBSC system of the present invention.

The overall system flow is illustrated in FIG. 2. The user enters the functional specifications of the circuit into the knowledge based silicon compiler (KBSC) 10 in the form of a flowchart 11. The KBSC 10 then generates a netlist 15 from the flowchart. The netlist 15 includes a custom generated system controller, all other hardware cells required to implement the necessary operations, and interconnection information for connecting the hardware cells and the system controller. The netlist can be used as input to any existing VLSI layout and routing tool 16 to create mask data 18 for geometrical layout.

System Overview

Figure 3:
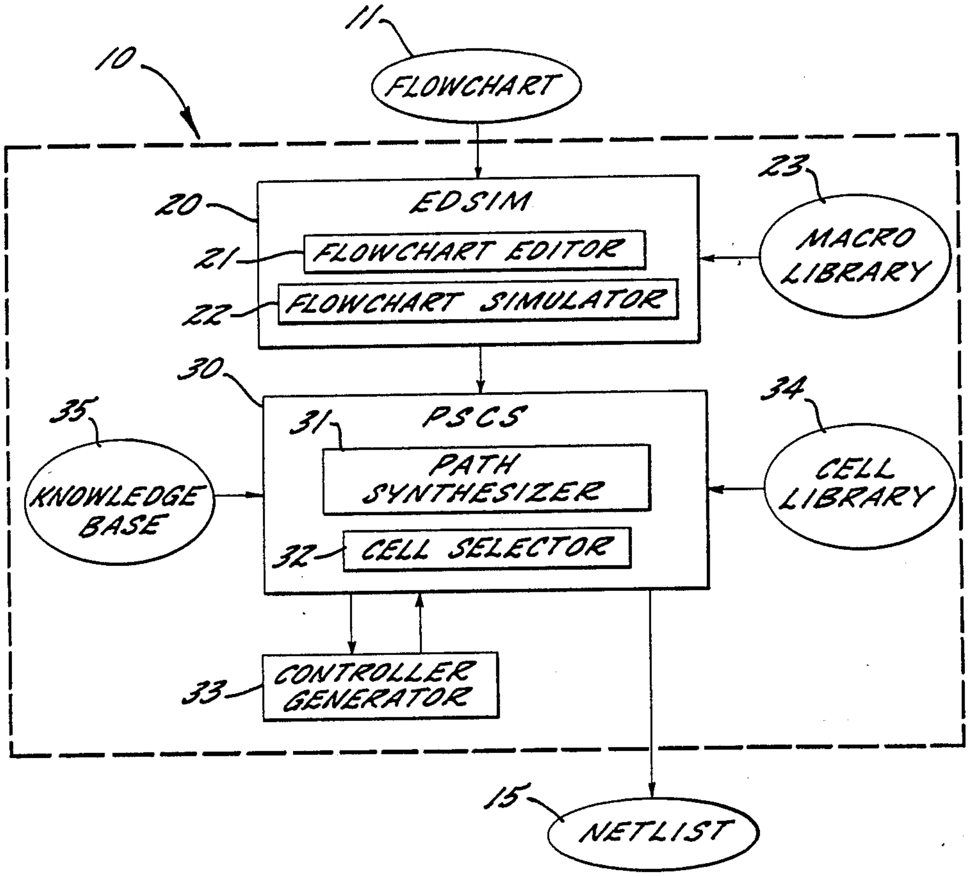
FIG. 3 is a somewhat more detailed schematic illustration showing the primary components of the KBSC system.

The primary elements or modules which comprise the KBSC system are shown in FIG. 3. In the embodiment illustrated and described herein, these elements or modules are in the form of software programs, although persons skilled in the appropriate art will recognize that these elements can easily be embodied in other forms, such as in hardware.

Referring more particularly to FIG. 3, it will be seen that the KBSC system 10 includes a program 20 called EDSIM, which comprises a flowchart editor 21 for creating and editing flowcharts and a flowchart simulator 22 for simulation and verification of flowcharts. Actions to be performed by each of the rectangles represented in the flowchart are selected from a macro library 23. A program 30 called PSCS (path synthesizer and cell selector) includes a data and control path synthesizer module 31, which is a knowledge based system for data and control path synthesis. PSCS also includes a cell selector 32 for selecting the cells required for system design. The cell selector 32 selects from a cell library 34 of previously designed hardware cells the appropriate cell or cells required to perform each action and condition represented in the flowchart. A controller generator 33 generates a custom designed system controller for controlling the operations of the other hardware cells. The knowledge base 35 contains ASIC design expert knowledge required for data path synthesis and cell selection. Thus, with a functional flowchart input, PSCS generates a system controller, selects all other hardware cells, generates data and control paths, and generates a netlist describing all of this design information.

Figure 4:
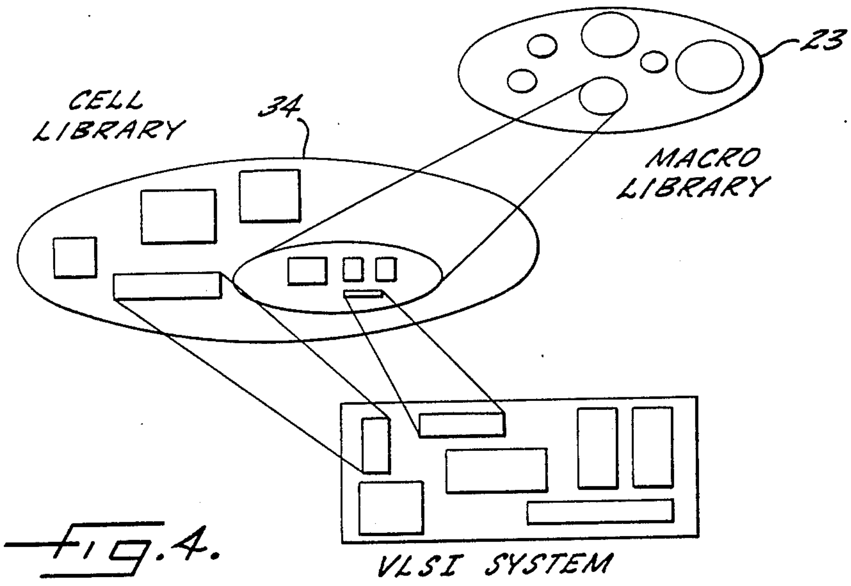
FIG. 4 is a schematic illustration showing how the ASIC design system of the present invention draws upon selected predefined integrated circuit hardware cells from a cell library.

The KBSC system employs a hierarchal cell selection ASIC design approach, as is illustrated in FIG. 4. Rather than generating every required hardware cell from scratch, the system draws upon a cell library 34 of previously designed, tested and proven hardware cells of various types and of various functional capabilities with a given type. The macro library 23 contains a set of macros defining various actions which can be specified in the flowchart. For each macro function in the macro library 23 there may be several hardware cells in the cell library 34 of differing geometry and characteristics capable of performing the specified function. Using a rule based expert system with a knowledge base 35 extracted from expert ASIC designers, the KBSC system selects from the cell library 34 the optimum cell for carrying out the desired function.

Referring again to FIG. 3, the cells selected by the cell selector 32, the controller information generated by the controller generator 33 and the data and control paths generated by the data/control path synthesizer 31 are all utilized by the PSCS program 30 to generate the netlist 15. The netlist is a list which identifies each block in the circuit and the interconnections between the respective inputs and outputs of each block. The netlist provides all the necessary information required to produce the integrated circuit. Computer-aided design systems for cell placement and routing are commercially available which will receive netlist data as input and will lay out the respective cells in the chip, generate the necessary routing, and produce mask data which can be directly used by a chip foundry in the fabrication of integrated circuits.

System Requirements

The KBSC system can be operated on a suitable programed general purpose digital computer. By way of example, one embodiment of the system is operated in a work station environment such as Sun3 and VAXStation-II/GPX Running UNIX Operating System and X Window Manager. The work station requires a minimum of 8 megabytes of main storage and 20 megabytes of hard disk space. The monitor used is a color screen with 8-bit planes. The software uses C programming language and INGRES relational data base.

The human interface is mainly done by the use of pop up menus, buttons, and a special purpose command language. The permanent data of the integrated circuit design are stored in the data base for easy retrieval and update. Main memory stores the next data temporarily, executable code, design data (flowchart, logic, etc.), data base (cell library), and knowledge base. The CPU performs the main tasks of creating and simulating flowcharts and the automatic synthesis of the design.

Flowchart Example

Figure 5:
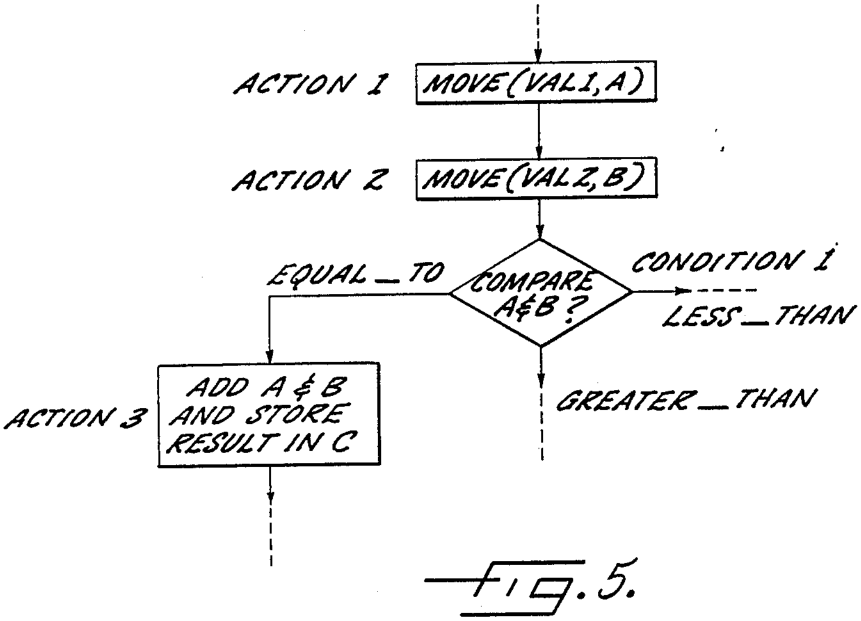
FIG. 5 is an example flowchart defining a sequence of functional operations to be performed by an integrated circuit.

To describe the mapping of a flowchart to a netlist, consider an example flowchart shown in FIG. 5, which is of part of a larger overall system. In this illustrative flowchart, two variables, VAL1 and VAL2 are compared and if they are equal, they are added together. In this instance, the first action (Action 1) involves moving the value of variable VALI to register A. The second action comprises moving the value of variable VAL2 to register B. Condition 1 comprises comparing the values in registers A and B. Action 3 comprises adding the values of registers A and B and storing the result in register C.

In producing an integrated circuit to carry out the function defined in FIG. 5, the KBSC maps the flowchart description of the behavior of the system to interconnection requirements between hardware cells. The hardware cells are controlled by a system controller which generates all control signals. There are two types of variables involved in a system controller:

(1) Input variables: These are generated by hardware cells, and/or are external input to the controller. These correspond to conditions in the flowchart.

(2) Output variables: These are generated by the system controller and correspond to actions in the flowchart.

Figure 6:
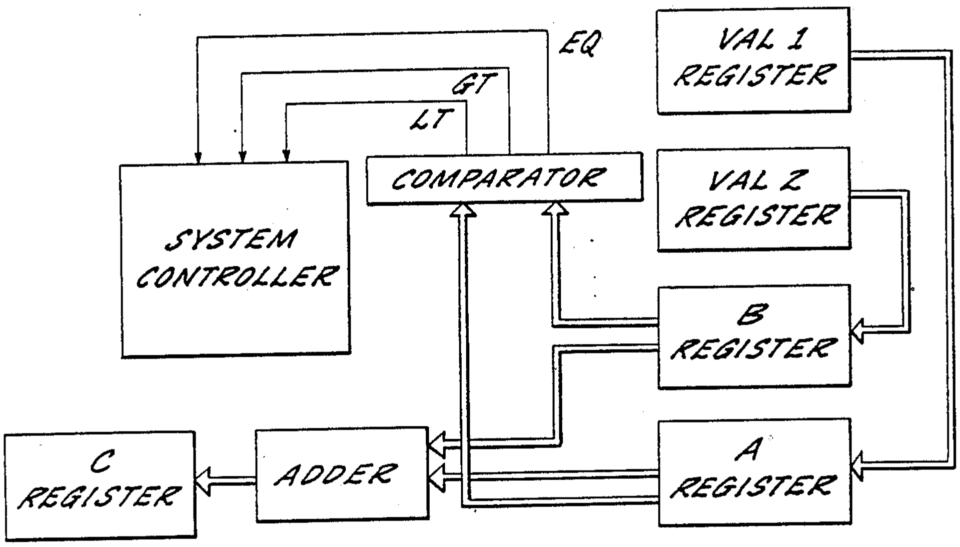
FIG. 6 is a structural representation showing the hardware blocks and interconnection requirements for the integrated circuit defined in FIG. 5.

FIG. 6 illustrates the results of mapping the flowchart of FIG. 5 onto hardware cells. The actions and the conditions in the flowchart are used for cell selection and data and control path synthesis. The VALI register and VAL2 register and the data paths leading therefrom have already been allocated in actions occurring before Action 1 in our example. Action 1 causes generation of the data register A. Similarly, Action 2 causes the allocation of data register B. The comparator is allocated as a result of the comparison operation in Condition 1. The comparison operation is accomplished by (1) selecting a comparator cell, (2) mapping the inputs of the comparator cell to registers A and B, (3) generating data paths to connect the comparator with the registers A and B and (4) generating input variables corresponding to equal to, greater than, and less than for the system controller. Similarly the add operation in Action 3 causes selection of the adder cell, mapping of the adder parameters to the registers and creating the data paths.

Following this methodology, a block list can be generated for a given flowchart. This block list consists of a system controller and as many other blocks as may be required for performing the necessary operations. The blocks are connected with data paths, and the blocks are controlled by the system controller through control paths. These blocks can be mapped to the cells selected from a cell library to produce a cell list.

Interactive Flowchart Editor and Simulator

The creation and verification of the flowchart is the first step in the VLSI design methodology. The translation from an algorithm to an equivalent flowchart is performed with the Flowchart Editor 21 (FIG. 3). The verification of the edited flowchart is performed by the Flowchart Simulator 22 The Flowchart Editor and Simulator are integrated into one working environment for interactive flowchart editing, with a designer friendly interface.

EDSIM is the program which contains the Flowchart Editor 21 and the Flowchart Simulator 22. It also provides functions such as loading and saving flowcharts. EDSIM will generate an intermediate file, called a statelist, for each flowchart. This file is then used by the PSCS program 30 to generate a netlist.

Flowchart Editor

The Flowchart Editor 21 is a software module used for displaying, creating, and editing the flowchart. This module is controlled through the flowchart editing window illustrated in FIG. 7. Along with editing functions the Flowchart Editor also provides checking of design errors.

The following is a description of the operations of the Flowchart Editor. The main editing functions include, create, edit, and delete states, conditions, and transitions. The create operation allows the designer to add a new state, condition, or transitions to a flowchart. Edit allows the designer to change the position of a state, condition or transition, and delete allows the designer to remove a state, condition or transition from the current flowchart. States which contain actions are represented by boxes, conditions are represented by diamonds, and transitions are represented by lines with arrows showing the direction of the transition.

Edit actions allows the designer to assign actions to each box. These actions are made up of macro names and arguments. An example of arguments is the setting and clearing of external signals. A list of basic macros available in the macro library 23 is shown in Table 1.

TABLE 1

| Macro | Description |
|---|---|
| ADD (A,B,C) | C = A + B |
| SUB (A,B,C) | C = A − B |
| MULT (A,B,C) | C = A * B |
| DIV (A,B,C) | C = A div B |
| DECR (A) | A = A − 1 |
| INCR (A) | A = A + 1 |
| CLR (A) | A = 0 |
| REG (A,B) | B = A |
| CMP (A,B) | Compare A to B and set EQ,LT,GT signals |
| CMP0 (A) | Compare A to 0 and set EQ,LT,GT signals |
| NEGATE (A) | A = NOT (A) |
| MOD (A,B,C) | C = A Modulus B |
| POW (A,B,C) | C = A B |
| DC2 (A,S1,S2,S3,S4) | Decode A into S1,S2,S3,S4 |
| EC2 (S1,S2,S3,S4,A) | Encode S1,S2,S3,S4 into A |
| MOVE (A,B) | B = A |
| CALL sub-flowchart (A,B, . . .) | Call a sub-flowchart. Pass A,B . . . |
| START (A,B, . . .) | Beginning state of a sub-flowchart |
| STOP (A,B . . .) | Ending state of a sub-flowchart |

Figure 7:
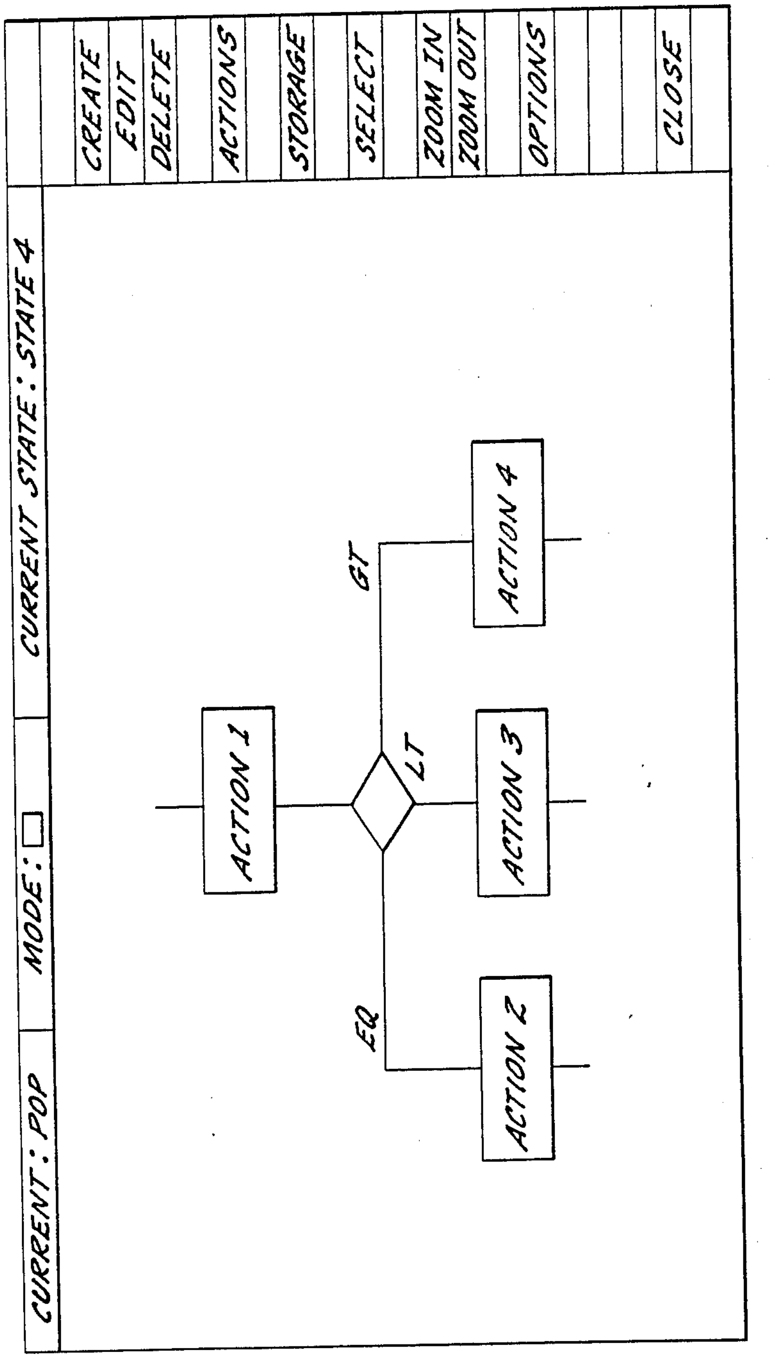
FIG. 7 is an illustration of the flowchart editor window.

The Flowchart Editor also provides a graphical display of the flowchart as the Flowchart Simulator simulates the flowchart. This graphical display consists of boxes, diamonds, and lines as shown in FIG. 7. All are drawn on the screen and look like a traditional flowchart. By displaying the flowchart on the screen during simulation it allows the designer to design and verify the flowchart at the same time.

Flowchart Simulator

Figure 8:
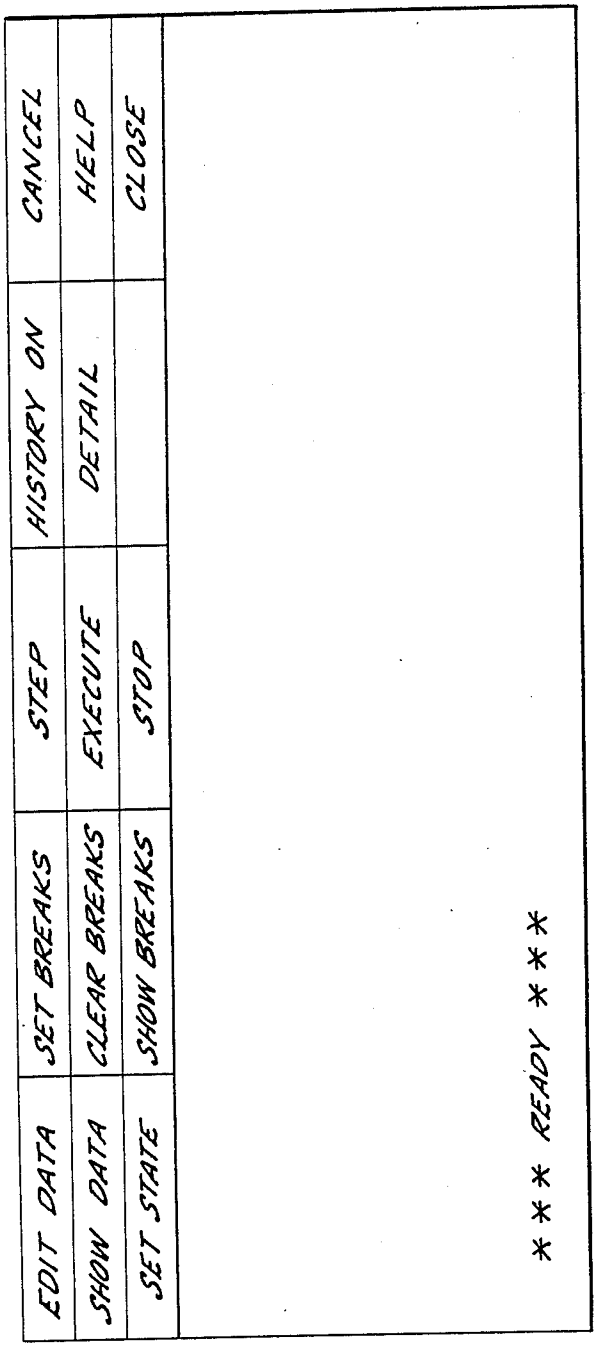
FIG. 8 is an illustration of the flowchart simulator window.

The Flowchart Simulator 22 is a software module used for simulating flowcharts. This module is controlled through the simulator window illustrated in FIG. 8. The Flowchart Simulator simulates the transitions between states and conditions in a flowchart. The following is a list of the operations of the Flowchart Simulator:

edit data—Change the value of a register or memory.
set state—Set the next state to be simulated.
set detail or summary display—Display summary or detail information during simulation.
set breaks—Set a breakpoint.
clear breaks—Clear all breakpoints.
show breaks—Display current breakpoints.
step—Step through one transition.
execute—Execute the flowchart.
stop—Stop executing of the flowchart. history ON or history OFF—Set history recording on or off.
cancel—Cancel current operation.
help—Display help screen.
close—Close the simulator window.

The results of the simulation are displayed within the simulator window. Also the editor window will track the flowchart as it is being simulated. This tracking of the flowchart makes it easy to edit the flowchart when an error is found.

Cell Selection

The Cell Selector 32 is a knowledge based system for selecting a set of optimum cells from the cell library 34 to implement a VLSI system. The selection is based on functional descriptions in the flowchart, as specified by the macros assigned to each action represented in the flowchart. The cells selected for implementing a VLSI system depend on factors such as cell function, fabrication technology used, power limitations, time delays etc. The cell selector uses a knowledge base extracted from VLSI design experts to make the cell selection.

To design a VLSI system from a flowchart description of a user application, it is necessary to match the functions in a flowchart with cells from a cell library. This mapping needs the use of artificial intelligence techniques because the cell selection process is complicated and is done on the basis of a number of design parameters and constraints. The concept used for cell selection is analogous to that used in software compilation. In software compilation a number of subroutines are linked from libraries. In the design of VLSI systems, a functional macro can be mapped to library cell.

FIG. 4 illustrates the concept of hierarchical cell selection. The cell selection process is performed in two steps:

(1) selection of functional macros
(2) selection of geometrical cells

A set of basic macros is shown in Table 1. A macro corresponds to an action in the flowchart. As an example, consider the operation of adding A and B and storing the result in C. This function is mapped to the addition macro ADD(X, Y, Z). The flowchart editor and flowchart simulator are used to draw the rectangles, diamonds and lines of the flowchart, to assign a macro selected from the macro library 23 to each action represented in the flowchart, and to verify the functions in flowcharts. The flowchart is converted into an intermediate form (statelist) and input to the Cell Selector.

The Cell Selector uses a rule based expert system to select the appropriate cell or cells to perform each action. If the cell library has a number of cells with different geometries for performing the operation specified by the macro, then an appropriate cell can be selected on the basis of factors such as cell function, process technology used, time delay, power consumption, etc.

The knowledge base of Cell Selector 32 contains information (rules) relating to:

(1) selection of macros
(2) merging two macros (3) mapping of macros to cells
(4) merging two cells
(5) error diagnostics The above information is stored in the knowledge base 35 as rules.

Cell List Generation

Figure 9:
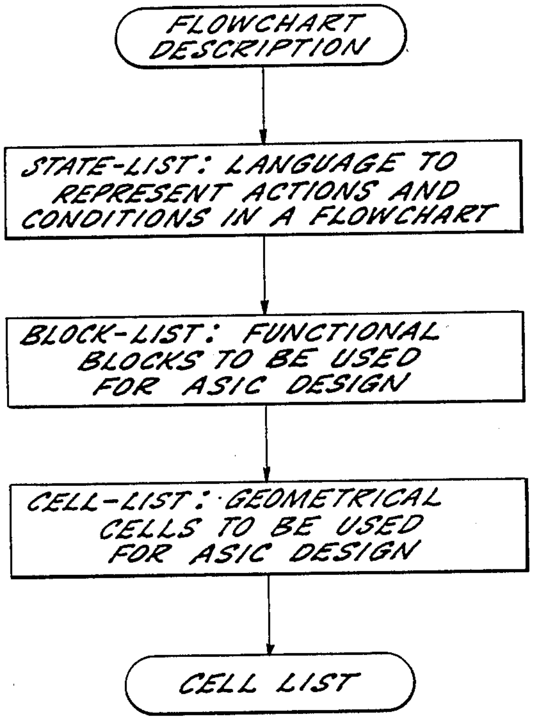
FIG. 9 is an illustration of the steps involved in cell list generation.

FIG. 9 shows the cell list generation steps. The first step of cell list generation is the transformation of the flowchart description into a structure that can be used by the Cell Selector. This structure is called the statelist. The blocklist is generated from the statelist by the inference engine. The blocklist contains a list of the functional blocks to be used in the integrated circuit. Rules of the following type are applied during this stage.

map arguments to data paths
map actions to macros
connect these blocks

Rules also provide for optimization and error diagnostics at this level.

The cell selector maps the blocks to cells selected from the cell library 34. It selects an optimum cell for a block. This involves the formulation of rules for selecting appropriate cells from the cell library. Four types of information are stored for each cell. These are:

(1) functional level information: description of the cell at the register transfer level.

(2) logic level information: description in terms of flip-flops and gates.

(3) circuit level information: description at the transistor level.

(4) Layout level information: geometrical mask level specification.

The attributes of a cell are:

cell name
description
function
width
height
status
technology
minimum delay
typical delay
maximum delay
power
file
designer
date
comment
inspector In the cell selection process, the above information can be used. Some parameters that can be used to map macros to cells are:

(1) name of macro
(2) function to be performed
(3) complexity of the chip
(4) fabrication technology
(5) delay time allowed
(6) power consumption
(7) bit size of macro data paths

Netlist Generation

The netlist is generated after the cells have been selected by PSCS. PSCS also uses the macro definitions for connecting the cell terminals to other cells. PSCS uses the state-to-state transition information from an intermediate form representation of a flowchart (i.e. the statelist) to generate a netlist. PSCS contains the following knowledge for netlist generation:

(1) Data path synthesis
(2) Data path optimization
(3) Macro definitions
(4) Cell library
(5) Error detection and correction The above information is stored in the knowledge base 35 as rules. Knowledge engineers help in the formulation of these rules from ASIC design experts. The macro library 23 and the cell library 34 are stored in a database of KBSC.

A number of operations are performed by PSCS. The following is a top level description of PSCS operations:

(1) Read the flowchart intermediate file and build a statelist.

(2) current_context=START (3) Start the inference engine and load the current context rules.

(4) Perform one of the following operations depending upon current_context:

(a) Modify the statelist for correct implementation.
(b) Create blocklist, macrolist and data paths.
(c) Optimize blocklist and datapath list and perform error checks.
(d) Convert blocks to cells.
(e) Optimize cell list and perform error checks.
(f) Generate netlist.
(g) Optimize netlist and perform error checks and upon completion Goto 7.

(5) If current_context has changed, load new context rules.

(6) Goto 4.

(7) Output netlist file and stf files and Stop.

In the following sections, operations mentioned in step 4 are described. The Rule Language and PSCS display are also described.

Rule Language

The rule language of PSCS is designed to be declarative and to facilitate rule editing. In order to make the expert understand the structure of the knowledge base, the rule language provides means for knowledge representation. This will enable the format of data structures to be stated in the rule base, which will enable the expert to refer to them and understand the various structures used by the system. For example, the expert can analyze the structure of wire and determine its components. The expert can then refer these components into rules. If a new object has to be defined, then the expert can declare a new structure and modify some existing structure to link to this new structure. In this way, the growth of the data structures can be visualized better by the expert. This in turn helps the designer to update and append rules.

The following features are included in the rule language:

(i) Knowledge representation in the form of a record structure.

(ii) Conditional expressions in the antecedent of a rule.

(iii) Facility to create and destroy structure in rule actions.

(iv) The assignment statement in the action of a rule.

(v) Facility for input and output in rule actions.

(vi) Provide facility to invoke C functions from rule actions.

The rule format to be used is as follows:

| The rule format to be used is as follows: | | |
|---|---|---|
| Rule | <number> <context> | |
| If { | | |
| | <if-clause> | |
| } | | |
| Then | { | |
| | <then-clause> | |
| } | | |
| where | <number> | rule number |
| | <context> | context in which this rule is active |
| | <if-clause> | the condition part of the rule |
| | <then-clause> | the action part of the rule |

Inference Strategy

The inference strategy is based on a fast pattern matching algorithm. The rules are stored in a network and the requirement to iterate through the rules is avoided. This speeds up the execution. The conflict resolution strategy to be used is based on the following:

(1) The rule containing the most recent data is selected.

(2) The rule which has the most complex condition is selected.

(3) The rule declared first is selected.

Rule Editor

PSCS provides an interactive rule editor which enables the expert to update the rule set. The rules are stored in a database so that editing capabilities of the database package can be used for rule editing. To perform this operation the expert needs to be familiar with the various knowledge structures and the inferencing process. If this is not possible, then the help of a knowledge engineer is needed.

PSCS provides a menu from which various options can be set. Mechanisms are provided for setting various debugging flags and display options, and for the overall control of PSCS.

Facility is provided to save and display the blocklist created by the user. The blocklist configuration created by the user can be saved in a file and later be printed with a plotter. Also the PSCS display can be reset to restart the display process.

| PSCS Example Rules: | | |
|---|---|---|
| Rule 1 | | |
| | IF | no blocks exist |
| | THEN | generate a system controller. |
| Rule 2 | | |
| | IF | a state exists which has a macro AND this macro has not been mapped to a block |
| | THEN | find a corresponding macro in the library and generate a block for this macro. |
| Rule 3 | | |
| | IF | there is a transition between two states AND there are macros in these states using the same argument |
| | THEN | make a connection from a register corresponding to the first macro to another register corresponding to the second macro. |
| Rule 4 | | |
| | IF | a register has only a single connection from another register |
| | THEN | combine these registers into a single register. |
| Rule 5 | | |
| | IF | there are two comparators AND input data widths are of the same size AND one input of these is same AND the outputs of the comparators are used to perform the same operation. |
| | THEN | combine these comparators into a single comparator. |
| Rule 6 | | |
| | IF | there is a data without a register |
| | THEN | allocate a register for this data. |
| Rule 7 | | |
| | IF | all the blocks have been interconnected AND a block has a few terminals not connected |
| | THEN | remove the block and its terminals, or issue an error message. |
| Rule 8 | | |
| | IF | memory is to be used, but a block has not been created for it |
| | THEN | create a memory block with data, address, read and write data and control terminals. |
| Rule 9 | | |
| | IF | a register has a single connection to a counter |
| | THEN | combine the register and the counter; remove the register and its terminals. |
| Rule 10 | | |
| | IF | there are connections to a terminal of a block from many different blocks |
| | THEN | insert a multiplexor; remove the connections to the terminals and connect them to the input of the multiplexor; connect the output of the multiplexor to the input of the block. |

Additional rules address the following points:

remove cell(s) that can be replaced by using the outputs of other cell(s)

reduce multiplexor trees use fan-out from the cells, etc.

Soft Drink Vending Machine Controller Design Example

The following example illustrates how the previously described features of the present invention are employed in the design of an application specific integrated circuit (ASIC). In this illustrative example the ASIC is designed for use as a vending machine controller. The vending machine controller receives a signal each time a coin has been deposited in a coin receiver. The coin value is recorded and when coins totalling the correct amount are received, the controller generates a signal to dispense a soft drink. When coins totalling more than the cost of the soft drink are received, the controller dispenses change in the correct amount.

This vending machine controller example is patterned after a textbook example used in teaching digital system controller design. See Fletcher, William I., *An Enqineering Approach to Digital Design,* Prentice-Hall, Inc., pp. 491-505. Reference may be made to this textbook example for a more complete explanation of this vending machine controller requirements, and for an understanding and appreciation of the complex design procedures prior to the present invention for designing the hardware components for a controller.

Figure 10:
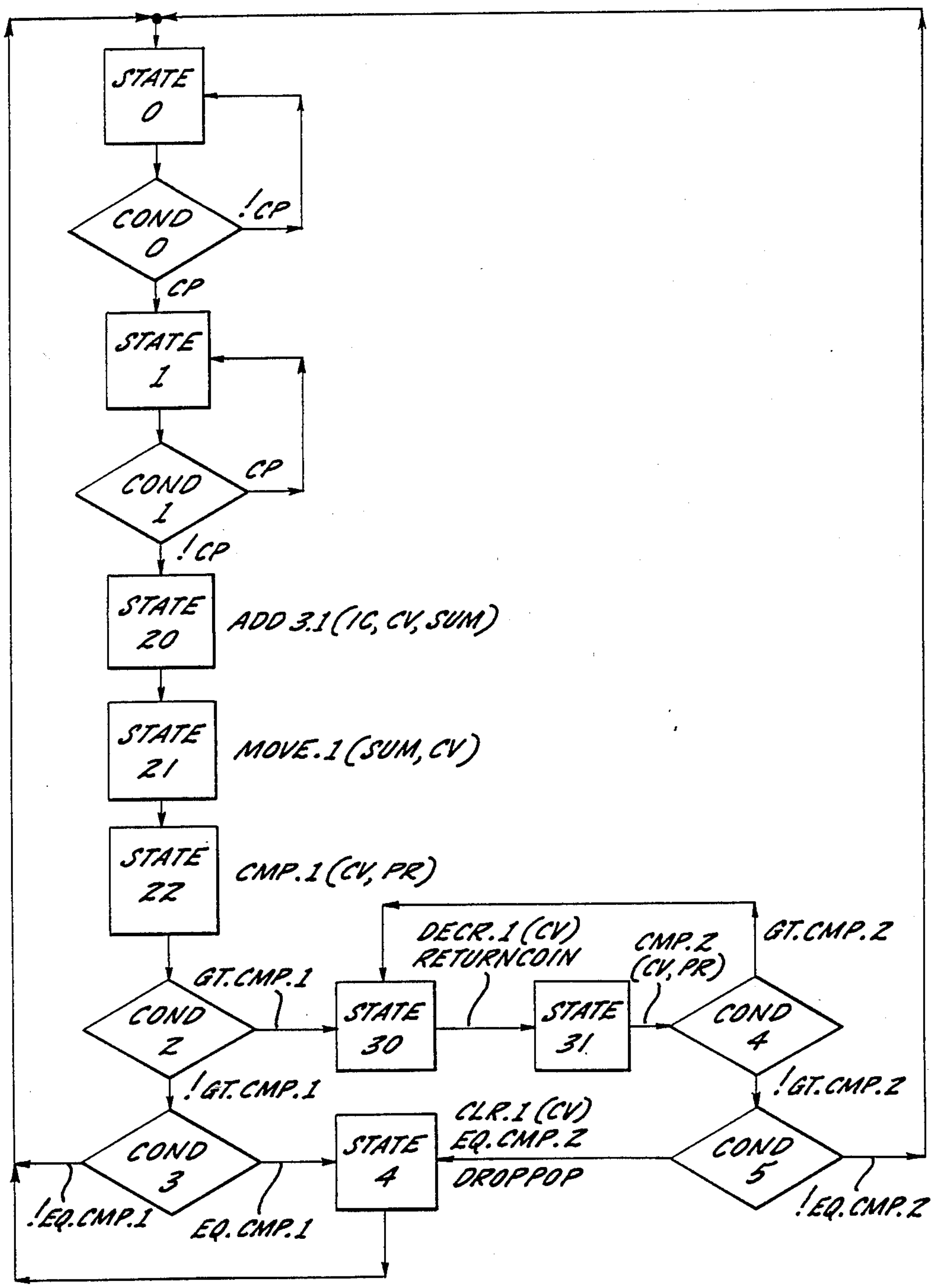
FIG. 10 is an example flowchart for a vending machine system.

FIG. 10 illustrates a flowchart for the vending machine controller system. This flowchart would be entered into the KBSC system by the user through the flowchart editor. Briefly reviewing the flowchart, the controller receives a coin present signal when a coin is received in the coin receiver. State0 and cond0 define a waiting state awaiting deposit of a coin. The symbol CP represents "coin present" and the symbol !CP represents "coin not present". Statel and condI determine when the coin has cleared the coin receiver. At state20, after receipt of a coin, the macro instruction ADD3.1 (lc, cv, sum) instructs the system to add lc (last coin) and cv (coin value) and store the result as sum. The macro instruction associated with state21 moves the value in the register sum to cv. The macro CMP.1 at state22 compares the value of cv with PR (price of soft drink) and returns signals EQ, GT and LT. The condition cond2 tests the result of the compare operation CMP.1. If the result is "not greater than" (!GT.CMP.1), then the condition cond3 tests to see whether the result is "equal" (EQ.CMP.1). If the result is "not equal" (!EQ.CMP.1), then control is returned to state0 awaiting the deposit of another coin. If cond3 is EQ, then state4 generates a control signal to dispense a soft drink (droppop) and the macro instruction CLR.1(cv) resets cv to zero awaiting another customer.

If the total coins deposited exceed the price, then state30 produces the action "returncoin". Additionally, the macro DECR.1 (cv) reduces the value of cv by the amount of the returned coin. At state31 cv and PR are again compared. If cv is still greater than PR, then control passes to state30 for return of another coin. The condition cond5 tests whether the result of CMP.2 is EQ and will result in either dispensing a drink (droppop) true or branching to state0 awaiting deposit of another coin. The macros associated with the states shown in FIG. 10 correspond to those defined in Table 1 above and define the particular actions which are to be performed at the respective states.

Appendix A shows the intermediate file or "statelist" produced from the flowchart of FIG. 10. This statelist is produced as output from the EDSIM program 20 and is used as input to the PSCS program 30 (FIG. 3).

Figure 11:
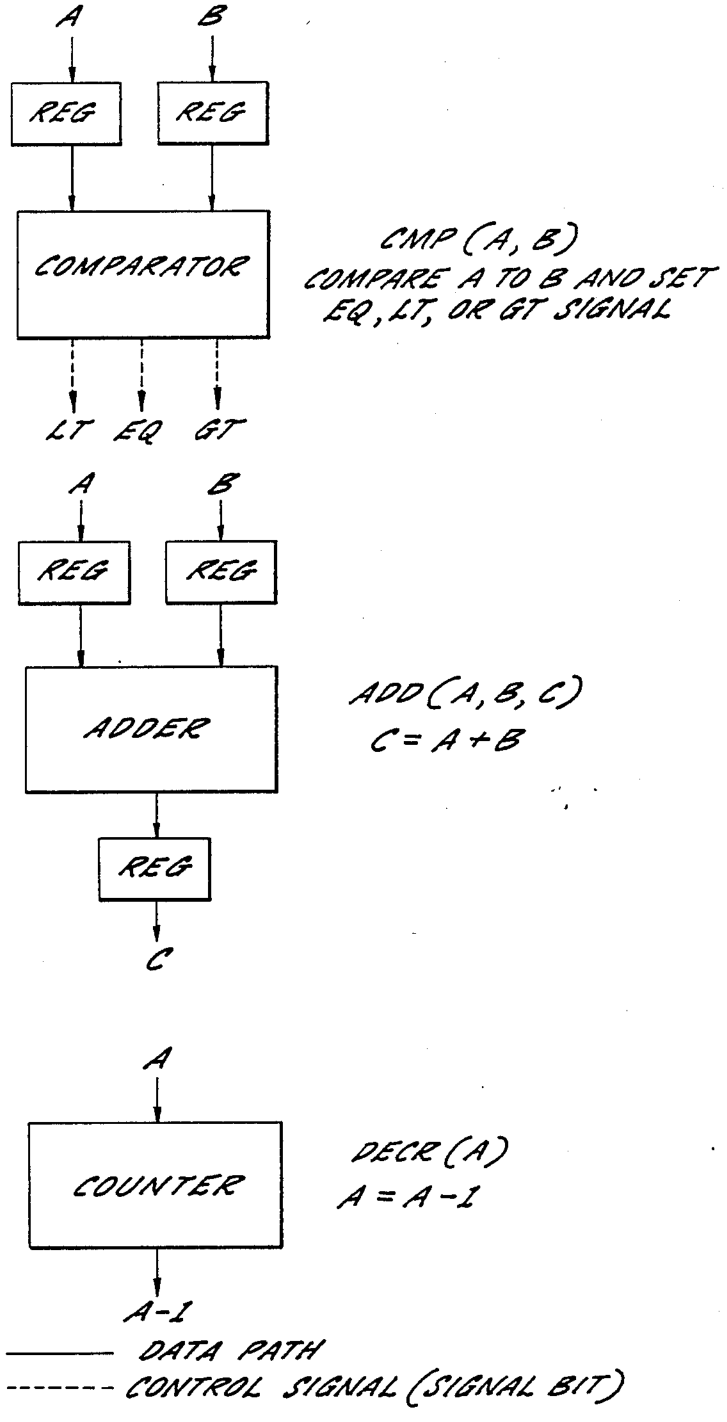
FIG. 11 illustrates the hardware components which correspond to each of the three macros used in the flowchart of FIG. 10.

FIG. 11 illustrates for each of the macros used in the flowchart of FIG. 10, the corresponding hardware blocks. It will be seen that the comparison macro CMP (A,B) results in the generation of a register for storing value A, a register for storing value B, and a comparator block and also produces control paths to the system controller for the EQ, LT, and GT signals generated as a result of the comparison operation. The addition macro ADD (A,B,C) results in the generation of a register for each of the input values A and B, a register for the output value C, and in the generation of an adder block. The macro DECR (A) results in the generation of a counter block. The PSCS program 30 maps each of the macros used in the flowchart of FIG. 10 to the corresponding hardware components results in the generation of the hardware blocks shown in FIG. 12. In generating the illustrated blocks, the PSCS program 30 relied upon rules 1 and 2 of the above listed example rules.

Figure 12:
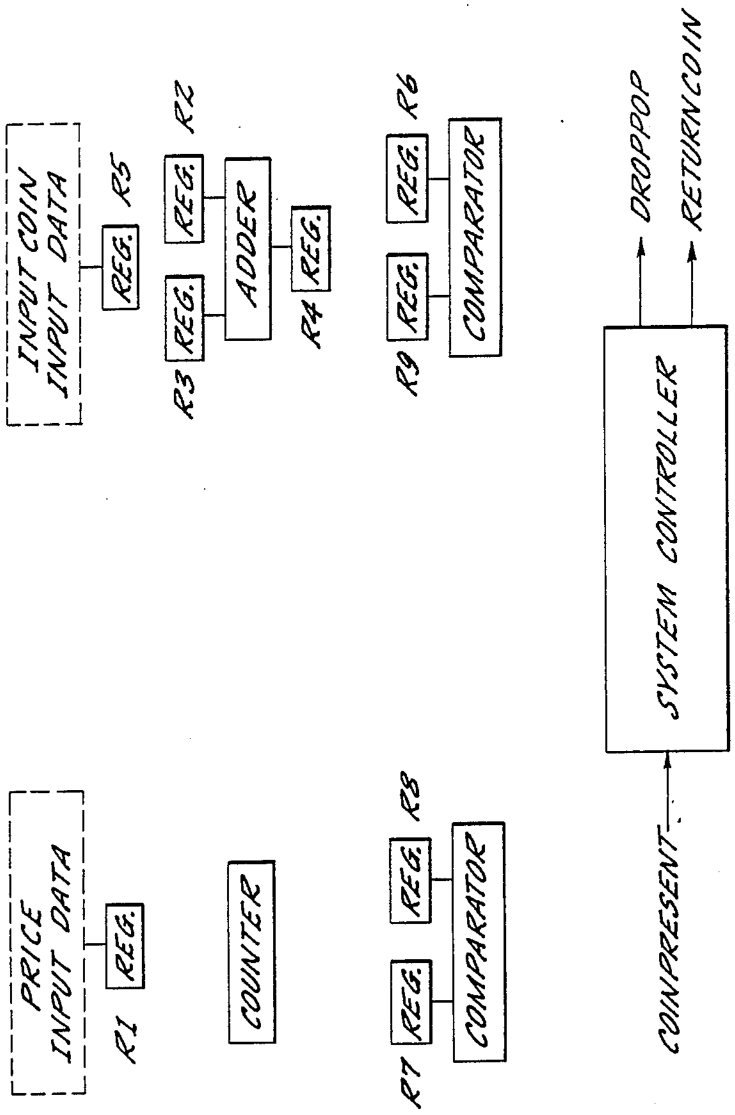
FIG. 12 is an initial block diagram showing the hardware components for an integrated circuit as defined in the flowchart of FIG. 10.
Figure 13:
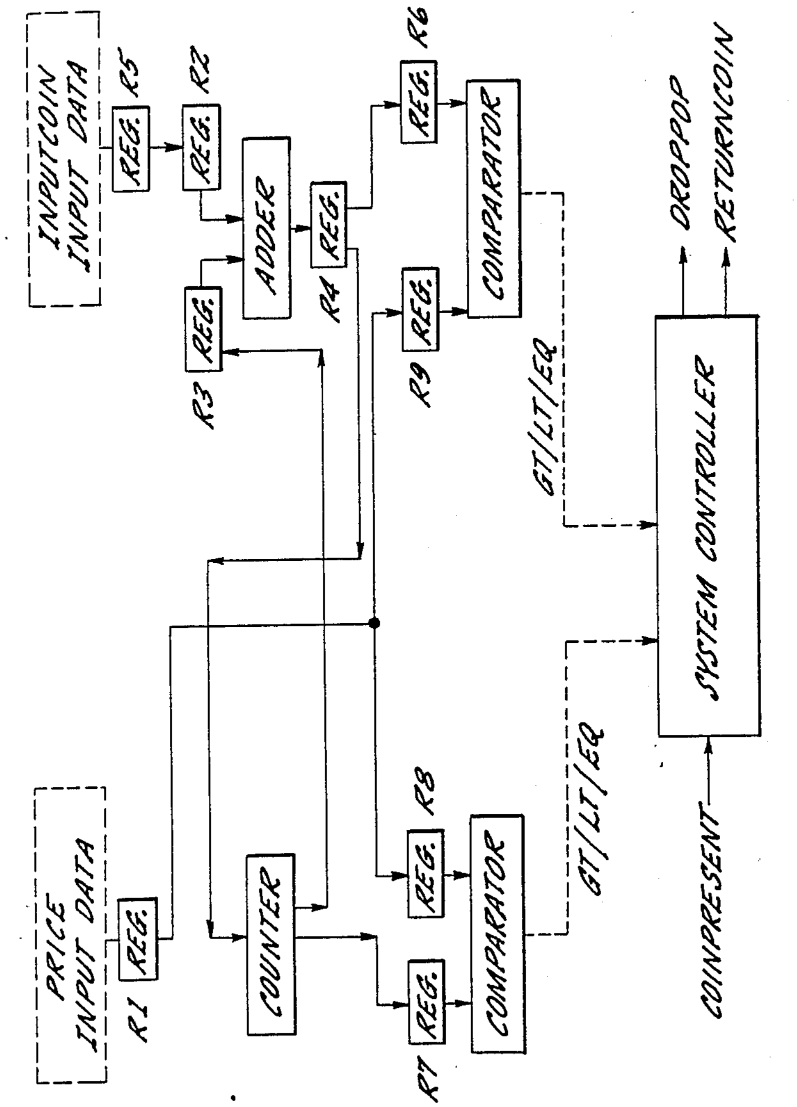
FIG. 13 is a block diagram corresponding to FIG. 12 showing the interconnections between blocks.

FIG. 13 illustrates the interconnection of the block of FIG. 12 with data paths and control paths. Rule 3 was used by the data/control path synthesizer program 31 in mapping the data and control paths.

Figure 14:
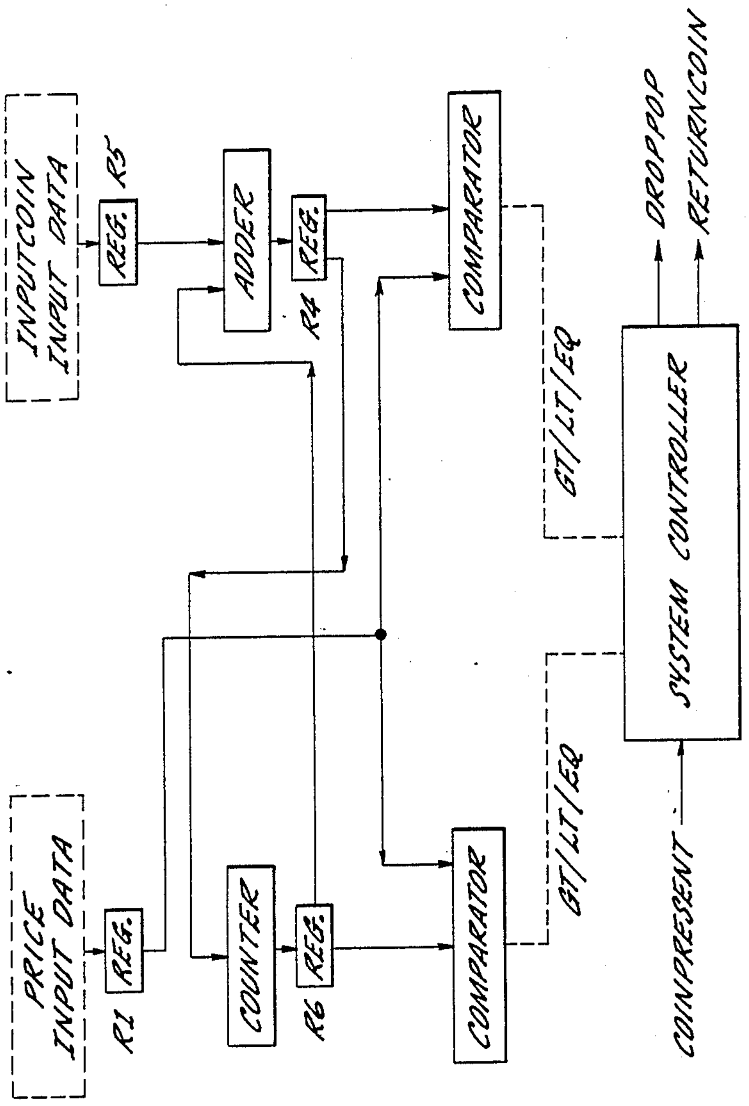
FIG. 14 is a block diagram corresponding to FIG. 13 after register optimization.
Figure 15:
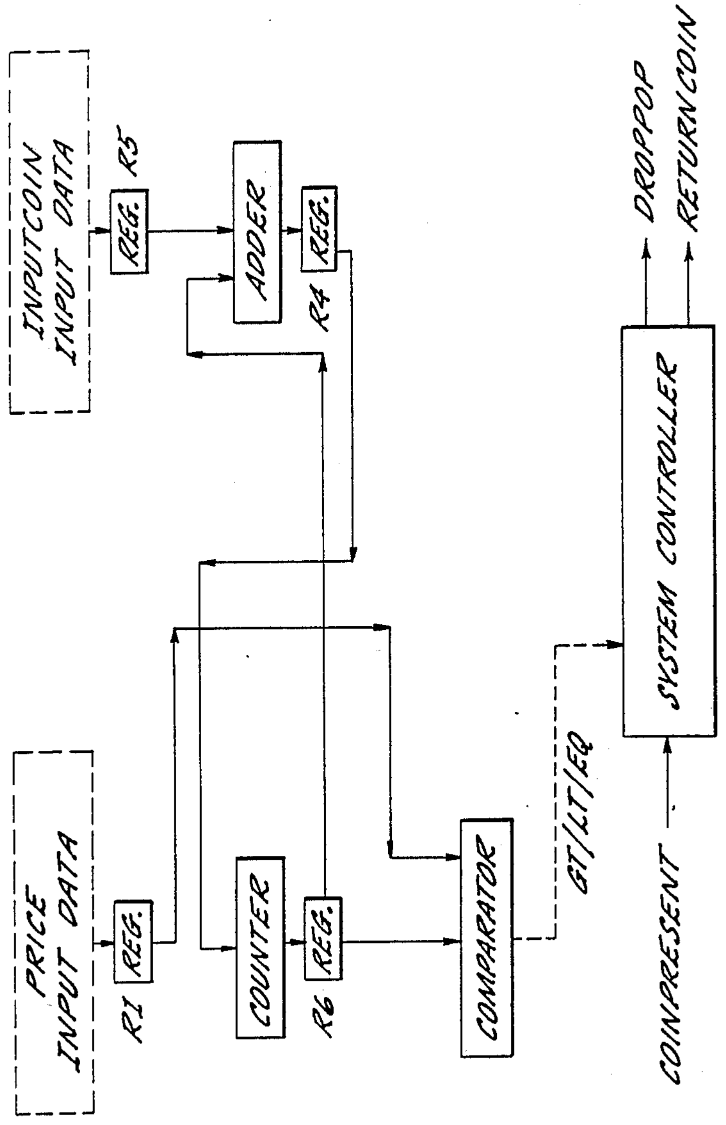
FIG. 15 is a block diagram corresponding to FIG. 14 after further optimization.

FIG. 14 shows the result of optimizing the circuit by applying rule 4 to eliminate redundant registers. As a result of application of this rule, the registers R2, R3, R7, R8, and R9 in FIG. 13 were removed. FIG. 15 shows the block diagram after further optimization in which redundant comparators are consolidated. This optimization is achieved in the PSCS program 30 by application of rule 5.

Having now defined the system controller block, the other necessary hardware blocks and the data and control paths for the integrated circuit, the PSCS program 30 now generates a netlist 15 defining these hardware components and their interconnection requirements. From this netlist the mask data for producing the integrated circuit can be directly produced using available VLSI CAD tools.

```
name rpop;
data path @ic<0:5>, cv<0:5>, sum<0:5>, @pr<0:5>;
{
state4 : state0;
state30 : state31;
state21 : state22;
state20 : state21;
state0 :. !cp state0;
state0 :. cp state1;
state1 :. cp state1;
state1 :. !cp state20;
state22 :. GT.CMP.1 state30;
state22 :. !GT.CMP.1*EQ.CMP.1 state4;
state22 :. !GT.CMP.1*!EQ.CMP.1 state0;
state31 :. GT.CMP.2 state30;
state31 :. !GT.CMP.2*EQ.CMP.2 state4;
state31 :. !GT.CMP.2*!EQ.CMP.2 state0;
state30 :: returncoin;
state30 :: DECR.1(cv);
state4 :: droppop;
state4 :: CLR.1(cv);
state31 :: CMP.2(cv,pr);
state22 :: CMP.1(cv,pr);
state21 :: MOVE.1(sum,cv);
state20 :: ADD3.1(ic,cv,sum);
}
```

That which I claimed is:

1. A computer-aided design system for designing an application specific integrated circuit directly from architecture independent functional specifications for the integrated circuit, comprising a macro library defining a set of architecture independent operations comprised of actions and conditions;

input specification means operable by a user for defining architecture independent functional specifications for the integrated circuit, said functional specifications being comprised of a series of operations comprised of actions and conditions, said input specification means including means to permit the user to specify for each operation a macro selected from said macro library;

a cell library defining a set of available integrated circuit hardware cells for performing the available operations defined in said macro library;

cell selection means for selecting from said cell library for each macro specified by said input specification means, appropriate hardware cells for performing the operation defined by the specified macro, said cell selection means comprising an expert system including a knowledge base containing rules for. selecting hardware cells from said cell library and inference engine means for selecting appropriate hardware cells from said cell library in accordance with the rules of said knowledge base; and netlist generator means cooperating with said cell selection means for generating as output from the system a netlist defining the hardware cells which are needed to achieve the functional requirements of the integrated circuit and the connections therebetween.

2. The system as defined in claim 1 wherein said input means comprises means specification for receiving user input of a list defining the series of actions and conditions.

3. The system as defined in claim 1 additionally including mask data generator means for generating from said netlist the mask data required to produce an integrated circuit having the specified functional requirements.

4. The system as defined in claim 1 wherein said input means comprises flowchart editor means specification for creating a flowchart having elements representing said series of actions and conditions.

5. The system as defined in claim 4 additionally including flowchart simulator means for simulating the functions defined in the flowchart to enable the user to verify the operation of the integrated circuit.

6. The system as defined in claim 1 additionally including data path generator means cooperating with said cell selection means for generating data paths for the hardware cells selected by said cell selection means.

7. The system as defined in claim 6 wherein said data path generator means comprises a knowledge base containing rules for selecting data paths between hardware cells and inference engine means for selecting data paths between the hardware cells selected by said cell selection means in accordance with the rules of said knowledge base and the arguments of the specified macros.

8. The system as defined in claim 6 additionally including control generator means for generating a controller and control paths for the hardware cells selected by said cell selection means.

9. A computer-aided design system for designing an application specific integrated circuit directly from a flowchart defining architecture independent functional requirements of the integrated circuit comprising a marco library defining a set of architecture independent operations comprised of actions and conditions;

flowchart editor means operable by a user for creating a flowchart having elements representing said architecture independent operations;

said flowchart editor means including macro specification means for permitting the user to specify for each operation represented in the flowchart a macro selected from said macro library;

a cell library defining a set of available integrated circuit hardware cells for performing the available operations defined in said macro library;

cell selection means for selecting form said cell library for each specified macro, appropriate hardware cells for performing the operation defined by the specified macro, said cell selection means comprising an expert system including a knowledge base containing rules for selecting hardware cells from said cell library and inference engine means for selecting appropriate hardware cells from said cell library in accordance with the rules of said knowledge base; and data path generator means cooperating with said cell selection means for generating data paths for the hardware cells selected by said cell selector means, said data path generator means comprising a knowledge base containing rules for selecting data paths between hardware cells and inference engine means for selecting data paths between hardware cells selected by said cell selection means in accordance with the rules of said knowledge base and the arguments of the specified macros.

10. The system as defined in claim 9 additionally including control generator means for generating a controller and control paths for the hardware cells selected by said cell selection means.

11. A computer-aided design system for designing an application specific integrated circuit directly from a flowchart defining architecture independent functional requirements of the integrated circuit, comprising flowchart editor means operable by a user for creating a flowchart having boxes representing architecture independent actions, diamonds representing architecture independent conditions, and lines with arrows representing transitions between actions and condition and including means for specifying for each box or diamond, a particular action or condition to be performed;

a cell library defining a set of available integrated circuit hardware cells for performing actions and conditions;

a knowledge base containing rules for selecting hardware cells from said cell library and for generating data and control paths for hardware cells; and expert system means operable with said knowledge base for translating the flowchart defined by said flowchart editor means into a netlist defining the necessary hardware cells and data and control paths required in an integrated circuit having the specified functional requirements.

12. The system as defined in claim 11 including mask data generator means for generating from said netlist the mask data required to produce an integrated circuit having the specified functional requirements.

13. A computer-aided design process for designing an application specific integrated circuit which will perform a desired function comprising storing a set of definitions of architecture independent actions and conditions;

storing data describing a set of available integrated circuit hardware cells for performing the actions and conditions defined in the stored set;

storing in an expert system knowledge base a set of rules for selecting hardware cells to perform the actions and conditions;

describing for a proposed application specific integrated circuit a series of architecture independent actions and conditions;

specifying for each described action and condition of the series one of said stored definitions which corresponds to the desired action or condition to be performed; and selecting from said stored data for each of the specified definitions a corresponding integrated circuit hardware cell for performing the desired function of the application specific integrated circuit, said step of selecting a hardware cell comprising applying to the specified definition of the action or condition to be performed, a set of cell selection rules stored in said expert system knowledge base and generating for the selected integrated circuit hardware cells, a netlist defining the hardware cells which are needed to perform the desired function of the integrated circuit and the interconnection requirements therefor.

14. A process as defined in claim 13, including generating from the netlist the mask data required to produce an integrated circuit having the desired function.

15. A process as defined in claim 13 including the further step of generating data paths for the selected integrated circuit hardware cells.

16. A process as defined in claim 15 wherein said step of generating data paths comprises applying to the selected cells a set of data path rules stored in a knowledge base and generating the data paths therefrom.

17. A process as defined in claim 16 including the further step of generating control paths for the selected integrated circuit hardware cells.

18. A knowledge based design process for designing an application specific integrated circuit which will perform a desired function comprising storing in a macro library a set of macros defining architecture independent actions and conditions;

storing in a cell library a set of available integrated circuit hardware cells for performing the actions and conditions;

storing in a knowledge base set of rules for selecting hardware cells from said cell library to perform the actions and conditions defined by the stored macros;

describing for a proposed application specific integrated circuit a flowchart comprised of elements representing a series of architecture independent actions and conditions which carry out the function to be performed by the integrated circuit;

specifying for each described action and condition of said series a macro selected from the macro library which corresponds to the action or condition; and applying rules of said knowledge base to the specified macros to select from said cell library the hardware cells required for performing the desired function of the application specific integrated circuit and generating for the selected integrated circuit hardware cells, a netlist defining the hardware cells which are needed to perform the desired function of the integrated circuit and the interconnection requirements therefor.

19. A process as defined in claim 18 also including the steps of storing in said knowledge base a set of rules for creating data paths between hardware cells, and applying rules of said knowledge base to the specified means to create data paths for the selected hardware cells.

20. A process as defined in claim 19 also including the steps of generating a controller and generating control paths for the selected hardware cells.

* * * * *

UNITED STATES PATENT AND TRADEMARK OFFICE
CERTIFICATE OF CORRECTION

PATENT NO. : 4,922,432

DATED : May 1, 1990

INVENTOR(S) : Hideaki Kobayashi, et al.

It is certified that error appears in the above-identified patent and that said Letters Patent is hereby corrected as shown below:

ON TITLE PAGE: under the section "References Cited" under "Other Publications":

"Verifying Compiled Silicon", by E. K. cheng, VLSI Design, Oct. 1984, pp. 1-4." should be -- "Verifying Compiled Silicon", by E. K. Cheng, VLSI Design, Oct. 1984, pp. 1-4." --.

"quality of Designs from An Automatic Logic Generator", by T. D. Friedman et al., IEEE 7th DA Conference, 1970, pp. 71-89." should be -- "Quality of Designs from An Automatic Logic Generator", by T. D. Friedman et al., IEEE 7th DA Conference, 1970, pp. 71-89. --.

"Trevillyan-Trickey, H., Flamel: *A High Level Hardward Compiler*, IEEE Transactions On Computer Aided Design, Mar. 1987, pp. 259-269." should be -- Trevillyan-Trickey, H., Flamel: *A High Level Hardware Compiler*, IEEE Transactions On Computer Aided Design, Mar. 1987, pp. 259-269. --.

<u>In the abstract</u>:

Every occurrence of "functional architecture independent" should be -- architecture independent functional --.

Column 1, line 19, "a" should be -- an --.

UNITED STATES PATENT AND TRADEMARK OFFICE
CERTIFICATE OF CORRECTION

PATENT NO. : 4,922,432

DATED : May 1, 1990

INVENTOR(S) : Hideaki Kobayashi, et al.

It is certified that error appears in the above-identified patent and that said Letters Patent is hereby corrected as shown below:

Column 2, line 10, "functional architecture independent" should be -- architecture independent functional --.

Column 2, line 21, "functional architecture independent" should be -- architecture independent functional --.

Column 2, lines 29-30, "functional architecture independent" should be -- architecture independent functional --.

Column 2, line 31, "structural" should be after "specific".

Column 3, lines 51-52, "representation" should be after "architecture independent".

Column 3, lines 61-62, "integrated" should be after "specific".

Column 6, line 62, after "22" insert -- . --.

Column 7, line 43 (in Table 1), "C = A B" should be -- C = A^B --.

Column 8, line 9 should end with the word "flowchart" and "history" should begin on the next line.

UNITED STATES PATENT AND TRADEMARK OFFICE
CERTIFICATE OF CORRECTION

PATENT NO. : 4,922,432
DATED : May 1, 1990
INVENTOR(S) : Hideaki Kobayashi, et al.

It is certified that error appears in the above-identified patent and that said Letters Patent is hereby corrected as shown below:

Column 10, line 23, "data paths" should be -- datapaths --.

Column 10, line 68, delete "The rule format to be used is as follows:".

Column 12, line 54, "Enqineering" should be -- Engineering --.

Column 13, line 55, "block" should be -- blocks --.

<u>In the Claims</u>:

Column 14, line 68, before "means" (first occurrence) insert -- specification --; after "means" (second occurrence) delete "specification".

Column 15, line 9, before "means" (first occurrence) insert -- specification --; after "means" (second occurrence) delete "specification".

Column 15, line 35, after "circuit" insert -- , --.

Column 15, line 36, "marco" should be -- macro --.

Column 15, line 49, "form" should be -- from --.

UNITED STATES PATENT AND TRADEMARK OFFICE

CERTIFICATE OF CORRECTION

PATENT NO. : 4,922,432

DATED : May 1, 1990

INVENTOR(S) : Hideaki Kobayashi, et al.

It is certified that error appears in the above-identified patent and that said Letters Patent is hereby corrected as shown below:

Column 16, line 14, "condition" should be -- conditions --.

Column 17, line 19, after "base" insert -- a --.

Signed and Sealed this

Fourteenth Day of January, 1992

*Attest:*

HARRY F. MANBECK, JR.

*Attesting Officer*

*Commissioner of Patents and Trademarks*

US004922432C1

(12) EX PARTE REEXAMINATION CERTIFICATE (8405th)

United States Patent (10) Number: US 4,922,432 C1

Kobayashi et al. (45) Certificate Issued: Jul. 19, 2011

(54) KNOWLEDGE BASED METHOD AND APPARATUS FOR DESIGNING INTEGRATED CIRCUITS USING FUNCTIONAL SPECIFICATIONS

(75) Inventors: Hideaki Kobayashi, Columbia, SC (US); Masahiro Shindo, Osaka (JP)

(73) Assignee: Ricoh Company, Ltd., Tokyo (JP)

Reexamination Request:
No. 90/007,879, Jan. 17, 2006
No. 90/007,945, Feb. 22, 2006
No. 90/009,094, Mar. 28, 2008

Reexamination Certificate for:

| | |
|---|---|
| Patent No.: | **4,922,432** |
| Issued: | **May 1, 1990** |
| Appl. No.: | **07/143,821** |
| Filed: | **Jan. 13, 1988** |

Certificate of Correction issued Jan. 14, 1992.

(51) Int. Cl.
*G06F 17/50* (2006.01)

(52) U.S. Cl. ........................ 716/102; 345/441; 716/104; 716/106

(58) Field of Classification Search .................... 716/17; 345/441
See application file for complete search history.

(56) References Cited

U.S. PATENT DOCUMENTS

| | | | |
|---|---|---|---|
| 3,996,673 | A | 12/1976 | Vorst et al. |
| 4,141,079 | A | 2/1979 | Grier et al. |
| 4,146,925 | A | 3/1979 | Green et al. |
| 4,179,823 | A | 12/1979 | Sullivan et al. |
| 4,179,824 | A | 12/1979 | Marsh |
| 4,181,971 | A | 1/1980 | Frey et al. |
| 4,208,719 | A | 6/1980 | Lotz et al. |
| 4,231,096 | A | 10/1980 | Hansen et al. |
| 4,249,171 | A | 2/1981 | Batcher |
| 4,360,884 | A | 11/1982 | Okada et al. |
| 4,388,620 | A | 6/1983 | Sherman |
| 4,422,105 | A | 12/1983 | Rodesch et al. |
| 4,445,169 | A | 4/1984 | Wakita et al. |
| 4,447,881 | A | 5/1984 | Brantingham et al. |
| 4,449,180 | A | 5/1984 | Ohshima et al. |
| 4,458,330 | A | 7/1984 | Imsand et al. |
| 4,475,161 | A | 10/1984 | Stock |
| 4,490,781 | A | 12/1984 | Kishi et al. |

(Continued)

OTHER PUBLICATIONS

Knowledge–Based Expert Systems and Their Application, W. Birmingham, R., Joobbani, and J. Kin, Proceedings of the 23rd DAC, pp. 531–539, 1986.

DAS/Logic: A Rule–based Logic Design Assistant, W. Birmingham and J. Kim, Proceedings of the Second Conference on Artificial Intelligence Applications, IEEE Computer Society, Dec. 11–13, 1985.

(Continued)

*Primary Examiner*—Roland G. Foster

(57) ABSTRACT

The present invention provides a computer-aided design system and method for designing an application specific integrated circuit which enables a user to define architecture independent functional specifications for the integrated circuit and which translates the architecture independent functional specifications into the detailed information needed for directly producing the integrated circuit. The architecture independent functional specifications of the desired integrated circuit can be defined at the architecture independent functional level in a flowchart format. From the flowchart, the system and method uses artificial intelligence and expert systems technology to generate a system controller, to select the necessary integrated circuit hardware cells needed to achieve the functional specifications, and to generate data and control paths for operation of the integrated circuit. This list of hardware cells and their inteconnection requirements is set forth in a netlist. From the netlist it is possible using known manual techniques or existing VLSI CAD layout systems to generate the detailed chip level topological information (mask data) required to produce the particular application specific integrated circuit.

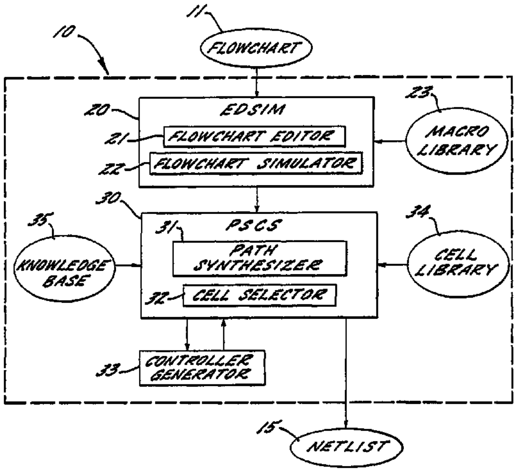

U.S. PATENT DOCUMENTS

| | | | | |
|---|---|---|---|---|
| 4,491,836 | A | 1/1985 | Collmeyer et al. | |
| 4,491,925 | A | 1/1985 | Richards | |
| 4,493,045 | A | 1/1985 | Hughes | |
| 4,514,810 | A | 4/1985 | Ito et al. | |
| 4,523,106 | A | 6/1985 | Tanizawa et al. | |
| 4,551,816 | A | 11/1985 | Hyatt | |
| 4,564,773 | A | 1/1986 | Tanizawa et al. | |
| 4,564,915 | A | 1/1986 | Evans et al. | |
| 4,577,276 | A | 3/1986 | Dunlop et al. | |
| 4,580,231 | A | 4/1986 | Tidd et al. | |
| 4,580,236 | A | 4/1986 | Tsujioka et al. | |
| 4,583,179 | A | 4/1986 | Horii et al. | |
| 4,584,653 | A | 4/1986 | Chih | |
| 4,612,618 | A | 9/1986 | Pryor et al. | |
| 4,613,940 | A | 9/1986 | Shenton et al. | |
| 4,621,339 | A | 11/1986 | Wagner et al. | |
| 4,630,219 | A | 12/1986 | DiGiacomo et al. | |
| 4,642,890 | A | 2/1987 | Hechtman | |
| 4,651,284 | A * | 3/1987 | Watanabe et al. | 716/8 |
| 4,654,804 | A | 3/1987 | Thaden et al. | |
| 4,656,596 | A | 4/1987 | Thaden et al. | |
| 4,656,603 | A | 4/1987 | Dunn | |
| 4,658,247 | A | 4/1987 | Gharachorloo | |
| 4,660,155 | A | 4/1987 | Thaden et al. | |
| 4,670,846 | A | 6/1987 | Laws | |
| 4,675,147 | A | 6/1987 | Schaefer et al. | |
| 4,675,832 | A | 6/1987 | Robinson | |
| 4,683,384 | A | 7/1987 | Shibata et al. | |
| 4,686,649 | A | 8/1987 | Rush et al. | |
| 4,689,502 | A | 8/1987 | Shimauchi et al. | |
| 4,691,287 | A | 9/1987 | Suzuki et al. | |
| 4,694,404 | A | 9/1987 | Meagher | |
| 4,694,407 | A | 9/1987 | Ogden | |
| 4,695,965 | A | 9/1987 | Fujita et al. | |
| 4,697,178 | A | 9/1987 | Heckel | |
| 4,697,241 | A | 9/1987 | Lavi | |
| 4,698,760 | A | 10/1987 | Lembach et al. | |
| 4,700,316 | A | 10/1987 | Nair | |
| 4,700,317 | A | 10/1987 | Watanabe et al. | |
| 4,700,320 | A | 10/1987 | Kapur | |
| 4,701,860 | A | 10/1987 | Mader | |
| 4,703,435 | A | 10/1987 | Darringer et al. | |
| 4,712,185 | A | 12/1987 | Aoki | |
| 4,965,882 | A | 10/1990 | Barbash et al. | |
| 5,126,950 | A * | 6/1992 | Rees et al. | 716/4 |
| 5,175,696 | A * | 12/1992 | Hooper et al. | 716/18 |

OTHER PUBLICATIONS

Programmable Logic for Parallel Convolution, Hideaki Kobayashi and Simon Y. Foo, mt. Conf on Computer Design (ICCD) '84, Port Chester, NY, Oct. 1984.

The Critter system—automating critiquing of digital circuit designs. Van Kelly, Proceedings of the 2nd IEEE Design Automation Conference, Jun. 1984.

McDermott, A Rule–based Configurer of Computer Systems, Artificial Intelligence, Elsevier, 13(1–2), pp. 41–72, 1982.

A Decision–Based Framework for Comparing Hardware Compilers, Jack Mostow, Journal of Systems and Software 4, Elsevier, pp. 39–50 (1984).

Toward Better Models of the Design Process, Jack Moslow, AI Magazine, AAAI, Menlo Park, CA, Spring 1985.

Thomas, Automatic Data Path Synthesis, in Design Methodologies, S. Goto (ed.), Elsevier Science Publishers (North Holland), 1986, p. 401–439.

Trevillyan, An Overview of Logic Synthesis Systems, Proceedings of the 24th DAC, pp. 166–171, 1987.

A Knowledge–Based Approach to VLSI CAD, L. Steinberg and T. Mitchell, in Proceedings of the 21st Design Automation Conference, IEEE and ACM, Jun. 1984.

Brayton, Rudell, Sangiovanni–Vincentelli, Wang, "MIS: A Multiple–Level Logic Optimization System," IEEE Transactions on Computer–Aided Design (Nov. 1987), pp. 1062–1081.

de Geus & Cohan, "A Rule–Based System for Optimizing Combinational Logic," IEEE Design & Test of computers, 22–32 (Aug. 1985).

de Geus, Bartlett Cohen, and Hachtel, "Synthesis and Optimization of Multilevel Logic Under timing Constraints" IEEE Trans on CAD of Integrated Circuits and Systems CAD—5, 4 (Oct. 1986) 582–596.

Director, Parker, Siewiorek, Thomas, "A design methodology and computer aids for digital VLSI systems" IEEE Transactions on Circuits and Systems, vol. Cas–28 No. 7, 634–645 (1981).

Yoon–Pin Simon Foo & Hideaki Kobayashi, "A Framework for Managing VLSI CAD Data," in Proceedings of the 1st International Conference on Applications on Artificial Intelligence to Engineering Problems, Southampton, England, vol. II, 889–98 (SP ringer Verlag, Apr. 1986).

Yoon–Pin Simon Foo & Hideaki Kobayashi, "A Knowledge–Based System for VLSI Module Selection," in Proce dings f the IEEE International Conference on Computer Design: VLSI in Computers (ICCD '86), Port Chester, New York 184–87 (IEEE Computer Society, Oct. 1986).

Harrison, Laidig, Moore, Reed, Sechen, Segal, Spickelmier, Wang, "OCT Tools Distribution 1.0," BDSyn User's Guide (Mar. 29, 1987).

Hoare, C., INMOS Limited; OCCAM Programming Manual(1984).

Kawato, N. et al., "DDL/SX: A Rule–Based Expert System for Logic Circuit Synthesis," Proceedings of Intl Symposium on Circuits and Systems, IEEE (1985) at 885–888.

Jin Kim, "Artificial Intelligence helps cut ASIC design time," Electronic Design (Jun. 11, 1987).

Kobayahi, Suehiro, Shindo, "KBSC A Knowledge–Based Approach to Automatic Logic Synthesis", Intl Journal of Computer Aided VLSI Design, 1989.

Kowalski, Thomas, "The VLSI Design Automation Assistant: Prototype System," 20th DAC, 479–483 (1983).

Kowalski, Geiger, Wolf, Fichtner "The VLSI Design Automation Assistant: A Birth in Industry" 1985 ISCAS 889–892 (1985).

Mano, I et al., "Knowledge–Based Expert System for Hardware Logic Design," Proceedings of 1986 Joint ACM–IEEE Computer Conference at 979–986.

Maruyama, F. et al., "Prolog–Based Expert System for Logic Design," Proceedings of Int'l Conference on Fifth Generation Computer Systems, (1984) at 563–571.

McFarland, "Using Bottom–Up Design Techniques in the Synthesis of Digital Hardware from Abstract Behavioral Descriptions," 23rd DAC 602–608 (1986).

McFarland, Kowalski "Assisting DAA: The Use of Global Analysis in an Expert System" 1986 ICCD 482–485 (1986).

Dirkes, "A Module Binder for the CMU–DA System," CMUCAD–85–43 (1985).

Saito, T., et al., "A Rule–Based Logic Circuit Synthesis System for CMOS Gate Arrays," Proceedings of 23rd DAC (1986) at 594–600.

Segal, "BDSyn: Logic Description Translator BDSyn: Switch–Level Simulator," Berkeley Technical Memorandum No. UCB/ECL M87/33 (May 21, 1987).
Trimeter Technologies, "Product Description: Logic Consultant" (1986).
Trimeter Technologies, "Trimeter Logic Consultant" (1987).
Uehara, T., et al., "A Knowledge–Based Logic Design System," IEEE Design & Test, vol. 2, No. 5 (Oct. 1985) at 27–34.
M. Yuschik and Kobayashi, A VLSi filter bank, IEEE ICASSP, Mar. 1984.
M. Yuschik and Kobayashi, VLSI digital filter bank design, SRC Topical Conf. on Design Synthesis, Carnegie Mellon University, Apr. 1984. (summary).
Kobayashi and C. Drozd, Efficient algorithms for routing interchangeable terminals, 1984.
M. Yuschik and Kobayashi, Top–down design of a VLSI digital filter bank, Integration, The VLSI Journal, North–Holland, 1985.
Kobayashi and T. Smith. SPAN: A synthesis program for adder networks, IEEE, 1984.
M. R. Buric, C. Christensen, and T. G. Matheson, "The Plex Project: VLSI Layouts of Microcomputers Generated by a Computer Program," Proc. International Conference on Computer Aided Design (ICCAD '83), pp. 49–50, 1983.
C. Christensen, T. G. Matheson, and M. R. Buric, "Simulation and Verification of Plex Microcomputers," Proc. International Conference on Computer Aided Design (ICCAD '83), pp. 57–58, 1983.
T. G. Matheson, M. R. Buric, and C. Christensen, "Embedding Electrical and Geometric Constraints in Hierarchical Circuit–Layout Generators," Proc. International Conference on Computer Aided Design (ICCAD '83), pp. 3–4, 1983.
Camposano, R. et al., "Automatic Data Path Synthesis from DSL Specifications," Proceedings of the IEEE Int'l Conf. on Computer Design (Oct. 1984) at pp. 630–635.
Camposano, R. et al., "A Design Environment for the Synthesis of Integrated Circuits," Proceedings of the EUROMICRO symposium on microprogramming and microprogramming (Sep. 1986) (Microcomputers, Usage and Design) at pp. 211–215.
Camposano R., "Synthesis Techniques for Digital Systems Design," Proceedings of the 22 Design Automation Conference at pp. 475–481 (1985).
Camposano R., et al, "Automatic Data Path Synthesis from Behavioral Level Descriptions in DSL" Proceedings of the Int'l Workshop on Parallel Computing & VLSI at 233–242 (May 1984).
Camposano R., et al., "Considering Timing Constraints in Synthesis From A Behavioral Description," in Proceedings of the IEEE Int'l Conf. on Computer Design (Oct. 1986) at pp. 6–9.
Rosenstiel, W. et al., "Synthesizing Circuits from Behavioral Level Specifications," Proceedings of the 7th Int'l Conference on Computer Hardware Description Languages and their Applications (1985) at pp. 391–403.
Rosenstiel, W., "Optimizations in High Level Synthesis," Microprocessing and Microprogramming, vol. 18 (1986) at pp. 347–352.
Rosenstiel, W., "Logic Synthesis," Logic Design and Simulation, (Hörbst, ed.) 31–53 (1986).
Kramer, H., et al., "Data Path and Control Synthesis in the CADDY System," in Logic and Architecture Synth sis for Silicon Compilers (1989) at pp. 229–242.
Girczyc, E., "Analysis of ADA as a Hardware Description Language," 1983 Canadian Conference on VLSI (Oct. 1983) at pp. 34–39.
Girczyc, E. et al., "An ADA to Standard Cell Hardware Compiler Based on Graph Grammars and Scheduling," In Proceedings of the 1984 IEEE Int'l Conf. on Computer Aided Design (ICCAD'84) at 726–731.
Ph.D. Dissertation of Girczyc, E., "Automatic Generation of Microsequenced Data Paths to Realize Ada Circuit Descriptions," Dept. of Electronics, Carleton University (Jul. 1984).
Girczyc, E. et al., "Applicability of a Subset of ADA as an Algorithmic Hardware Description Language for Graph–Based Hardware Compilation," IEEE Transactions on Computer–Aided Design, vol. CAD4, No. 2 (Apr. 1985) at 134–142.
Girczyc, E. et al., "Loop Winding—A Data Flow Approach to Functional Pipelining," in Proceedings of the 1987 IEEE Int'l Symposium on Circuits and Systems, at 382–385.
Goosens, Rabaey, Catthoor, Vanhoof, Jam, De Man, Vandewalle, "A Computer–Aided Design Methodology for Mapping DSP–Algorithms onto Custom Multiprocessor Architectures," Proc. of ISCAS '86, 924–926 (May 1986).
De Man, Rabaey, Six, Claesen, "Cathedral–IT: A Silicon Compiler for Digital Signal Processing," IEEE Design & Test, 13–25 (Dec. 1986).
Catthoor, Rabaey, Goosens, Van Meerbergen, Jam, De Man, Vandewalle, "General Datapath, Controller and Inter–Communication Architecture for the Creation of a Dedicated Multi–Processor Environment," Proc. of ISCAS'86, 730–732 (May 1986).
Goosens, Rabaey, Vandewalle, De Man, "An Efficient Microcode–Compiler for Custom DSP–Processors," Proceedings of ICCAD'87, 24–27 (Nov. 1987).
De Man, Rabaey, Six, "Cathedral II: A Synthesis and Module Generation System for Multiprocessor Systems on a Chip," Design Systems for VLSI Circuits, De Micheli, et al (eds.), 571–645 (1987).
Rabaey, De Man, Vanhoof, Goosens, Catthoor, "Cathedral–II: A Synthesis System for Multiprocessor DSP Systems," Silicon Compilation, Gajski (ed.), 311–360 (1988).
Brewer, Gajski, "An Expert System Paradigm of Design," 23rd DAC, 62–68 (1986).
Pangrle, B. et al., "Design Tools for Intelligent Silicon Compilation," IEEE Trans. on Computer–Aided Design, vol. CAD–6, No. 6 (Nov. 1987) at 1088–1112.
Pangrle, B. et al., "Slicer: A State Synthesizer for Intelligent Silicon Compilation," 1987 IEEE Int'l Conf. on Computer Design, at pp. 42–45.
Gajski, D. et al., "Towards Intelligent Silicon Compilation," Design Systems for VLSI Circuits 365–383 (1987).
Pangrle, B., "Splicer: A Heuristic Approach to Connectivity Binding," Proceedings of the 25th Design Automation Conference (1988) at 536–541.
Tseng, C–J. et al., "Automated Synthesis of Data Paths in Digital Systems," IEEE Trans. on Computer–Aided Design, vol. CAD–5, No. 3 (Jul. 1986) at pp. 379–395.
Wolf, "An Object–Oriented, Procedural Database for VLSI Chip Planning" 23rd DAC 744–751 (1986).
Wolf, Kowalski, McFarland, "Knowledge Engineering Issues in VLSI Synthesis" Proceedings of American Association for Artificial Intelligence 886–871 (1986).
Barabacci, Nagle, "The Symbolic Manipulation of Computer Descriptions: ISP S Application Note: An ISPS Simulator" (1978).

Snow, "Automation of Module Set Independent Register—Transfer Level Design" (1978).
Barabacci, Barnes, Cattell, Siewiorek, "The Symbolic Manipulation of Computer Descriptions: The ISPS Computer Description Language," CMUCS–79–137 (1979).
Barbacci, "Instruction Set Processor Specifications (ISPS): The Notation and Its Applications," IEEE Transactions on Computers, vol. C–30 No. 1, 24–40 (1981).
Leive, "The Design, Implementation, and Analysis of an Automated Logic Synthesis and Module Selection System," DRC–02–03–81 (1981).
Hafer, "Automated Synthesis of Digital Hardware," IEEE Trans. Computers, vol. C–31 No. 1, 93–109 (1982).
Thomas, Hitchook, Kowalski, Rajan, Walker, "Automatic Data Path Synthesis," Computer vol. 16 No. 12, 59–89 (1983).
Kowalski, Thomas, "The VLSI Design Automation Assistant: Learning to Walk," IEEE International Symposium on Circuits and Systems, 186–190 (1983).
Kowalski, Thomas, "The VLSI Design Automation Assistant: An IBM System/70 Design," IEEE Design & Test of computers, 60–69 (1984).
Kowalski, Thomas, "The VLSI Design Automation Assistant: What's in a Knowledge Base," 22nd DAC 252–258 (1985).
Kowalski, "The VLSI Design Automation Assistant: An Architecture Compiler," Silicon Compilation ch. 5 (ed. Gajski) (1988).
Bye, C.T., et al, "A Functional Modeling and Simulation Environments based on EXSIM and C," Proceedings of the IEEE Int'l Conf. on Computer–Aided Design (ICCAD) (Nov. 1984) at pp. 51–53.
Chi M., "An Automatic Rectilinear Partitioning Procedure for Standard Cells," Proceedings of 24th DAC (1987) at 50–55.
Frey E., "ESIM: A functional level simulation tool," Proceedings of the ICCAD (1984) at 48–53.
Hill D., "Sc2: A Hybrid Automatic Layout System," Proceedings of the ICCAD (1985) at 172–174.
Keutzer, K. et al., "DAGON: Technology Binding and Local Optimization by DAG Matching," Proceedings of 24th DAC (1987)at 341–347.
Keutzer, K. et al., "Anatomy of a Hardware Compiler," Proceedings of SIGPLAN 1988 Conf. on Programming Language Design and Implementation, at 95–104.
Stroud, C. et al., "CONES: A System of Automated Synthesis of VLSI and Programming Logic from Behavioral Models," Proceedings of the ICCAD (1986) at 428–431.
Stroud, C. et al., "Behavioral Model Synthesis with CONES," IEEE Design & Test of Computers, Jun. 1988, at 22–30.
Persky G. et al., "LTX—A System for the Directed Automatic Design of LSI Circuits," Proceedings of 13th DAC (1976) at 399–407.
Trickey, "Flamel: A High–Level Hardware Compiler," 6 IEEE Trans on CAD 259–269 (Mar. 1987).
Tricky, Compiling Pascal Programs into Silicon (Jul. 1985).
Yoon–Pin Simon Foo, "Managing VLSI Design Data with a Relational Database System," M.S. Thesis, Department of Electrical and Computer Engineering, University of South Carolina (1984).
Duley, Dietmeyer, "A Digital System Design Language (DDL)," IEEE Trans. on Computers, vol. C–17, No. 9 850–861 (1968).
Kawato, N. et al., "Design and Verification of Large–Scale Computers by Using DDL," Proceedings of 16th DAC (1979) at 360–366.
Kawato, N., et al., "An Interactive Logic Synthesis System Based Upon AT Techniques," Proceedings of 19th DAC (1982) at 858–864.
Mano, T. et al., "A Verifier Tightly Connected to Synthesis Expert System," Proceedings of 1987 Int'l Conference on Computer Aided Design (ICCAD) at 414–417.
Saito T., et al., "A CAD System for Logic Design Based On Frames and Demons," Proceedings of 18th DAC (1981) at 451–456.
Paulin, Knight, Girczyc, "HAL: A Multi–Paradigm Approach to Automatic Data Path Synthesis," 23rd DAC, 263–70 (1986).
Darringer, Joyner, "A New Look at Logic Synthesis", 17th DAC 543–549 (1980).
Rubin, "A logic design data entry system," Proc. International Conference, Circuits and Computers, pp. 107–110 (Jun. 1980).
Case, Correla, Gianopulos, Heller, Ofek, Raymond, Simek, Stieglitz, "Design Automation in IBM," 25 IBM J. Res. & Dcv. 63 1–46 (Sep. 1981).
J. Darringer, W.H. Joyner, C. L. Berman, L. Trevillyan, "Logic Synthesis Through Local Transformations," 25 IBM J. Res. & Dev. 272–280 (1981).
G.L. Smith, R.J. Bahnsen, H. Halliwell, "Boolean Comparison of Hardware and Flowcharts," 26 IBM J. Res. & Dev. 106–116 (1982).
Gustafson, Sparacio, "IBM 3081 Processor Unit: Design Considerations and Design Process," 26 IBM J. Res. & Dev. 12–2 1 (1982).
Reilly, Sutton, Nasser, Griscom, "Processor Controller for the IBM 3081," 26 IBM J. Res. & Dev. 22–29 (Jan. 1982).
Monachino, "Design Verification System for Large–Scale LSI Designs," 26 IBM J. Res. & Dev. 89–99 (Jan. 1982).
F. Rubin, P W. Horstman, "A Logic Design Front–End For Improved Engineering Productivity" 20th DAC 239–245 (1983).
J. B. Bendas, "D sign Through Transformation," 20th DAC 253–256 (1983).
Reprint of J. Darringer, D. Brand, JV Gerbi, W. H. Joyner, L. Trevillyan, "LSS: A system for Production Logic Synthesis," 28 IBM J. Res. & Dev. 537–545 (1984) in Reprinted 44 IBM J. Res. & Dcv. 157–165 (2000).
Dunn, "IBM's Engineering Design System Support for VLSI Design and Verification," IEEE Design & Test (1984).
Maissel, Ofek, "Hardware design and description languages in IBM," 28 IBM J. Res. & Dev., pp. 557–563 (1984).
Alberto L. Sangiovanni–Vincentelli, "An overflow of synthesis systems," IEEE 1985 Custom Integrated Circuits Conference, pp. 221–225.
Joyner, Trevillyan, Brand, Nix, Gundersen, "Technology Adaptation in Logic Synthesis," 23 DAC 94–100 (1986).
Aidridge, Keil, Panner, "A 40k Equivalent Gate CMOS Standard Cell Chip," Proc. IEEE Custom Integrated Circuits Conference, pp. 248–252 (May 4–7, 1987).
Darringer, Davidson, Hathaway, Koenemann, Lavin, Morrell, Rahmat, Roesner, Schanzenbach, Tellez, and Trevillyan, "EDA in IBM: Past, Present, and Future," IEEE Trans. On CAD of Integrated Circuits and Systems, vol. 19, No. 12, pp. 1476–1497 (Dec. 2000).

Baitinger, Mlynski, Trong, "The MEGA System: An Automated Methodology for Semi–Custom VLSI Chip Design," ICCAD 97–99 (1985).
Baitinger, Lipp, Mlynski, Reiss, "The MEGA System for Semi–Custom Design," Design Systems for VLSI Circuits 527–537 (1987).
Mathony, Baitinger "Fast efficient Algorithms for the Factorization of Multiple Output Logic Functions," 1988 ISCAS 1851–1854 (1988).
Mathony, Baitinger, "CARLOS: An Automated Multilevel Logic Design System for CMOS Semi–Custom Integrated Circuits," 7 CAD 346–355 (1988).
Trong, A Design Process for Multilevel Combinational Circuits Under Gate Array Constraints. (1984).
Marwedel, P., "The Mimola Design System: Detailed Description of the Software System," in Proceedings of the 16th Design Automation Conference (1979) at 59–63.
Zimmerman, G., "The Mimola Design System: A Computer Aided Digital Processor Design Method," In Proceedings of the I6 Design Automation Conference (1979) at pp .53–58.
Zimmerman, G., "MDS—The Mimola Design System," Journal of Digital Systems, vol. IV, Issue 3 (Fall 1980) at pp. 337–369.
Marwedel, P., "A Retargetable Compiler for a High–Level Microprogramming Language," in Proceedings of the 17thi Annual Microprogramming Workshop (Oct.–Nov. 1984) at 267–274.
Marwedel, P., "The Mimola Design System: Tools for the Design of Digital Processors," from 21st Design Automation Conference (1984) at pp. 587–593.
Marwedel, P., "A new synthesis algorithm for the MIMOLA software system," Proceedings of the 23 Design Automation Conference (1986) at pp. 271–277.
Marwedel, P., "An Algorithm for the Synthesis of Processor Structures from Behavioral Specifications," Microprocessing and Microprogrammin, vol. 18 (1986) at pp. 251–262.
Venkataraman V. et al., "GEMS: An Automatic Layout Tool for MIMOLA Schematics," from 23rd Design Automation Conference (1986) at pp. 131–137.
Bhasker, J., "An Algorithm for Microcode Compaction of VHDL Behavioral Descriptions," Proceedings of Micro–20 (1987) at pp. 54–58.
Bhasker, J. et al., "Compacting MIMOLA Microcode," Proceedings of Micro–20 (1987) at 97–105.
Bhasker, J. "Process–Graph Analyser: A Front–End Tool for VHDL Behavioral Synthesis," Software–Practice and Experience, vol. 18, No. 5 (May 1988) at pp. 469–483.
Bhasker, J., "Implementation of an Optimizing Compiler for VHDL," SIG Plan Notices, vol. 23, No. 1 (Jan. 1988) at pp. 92–108.
Duley, J.R., et al., "A Digital System Design Language (DDL)," IEEE Transactions on Computers, vol. C–17, No. 9 (Sep. 1968) at 850–861.
Ogawa, U, et al., "Knowledge Representation and Inference Environment: KRJNE," Proceedings of Conference on Fifth Generation Computer Systems—Tokyo, Japan (1984) at 643–651.
Takagi, S., "Rule Based Synthesis, Verification and Compensation of Data Paths," Proceedings of IEEE Conference on Computer Design (1984) at 133–138.
Simoudis, E., Fickas, S., The Application of Knowledge–based Design Techniques to Circuit Design Proc. International Conference on Computer Aided Design (ICCAD '85), pp. 213–215, 1985.
Gregory, Bartlett, de Geus, "Automatic Generation of Combinatorial Logic from a Functional Specification", ISCAS, 986–989 (1984).
Garrison, Gregory, Cohen, de Geus, "Automatic Area and Performance Optimization of Combinatorial Logic", ICCAD 2 12–214 (1984).
Bartlett and Hachtel, "Library Specific optimization of multilevel and combinatorial logic," in ICCD, Oct. 1985.
Cohen, Bartlett, de Geus, "Impact of Metarules in a Rule Based Expert System for Gate Level Optimization", ISCAS, 873–876 (1985).
Gregory, Bartlett, De Geus, Hachtel, "SOCRATES: A system for Automatically Synthesizing and Optimizing Combinatorial Logic" 23rd DAC, 79–85 (1986).
Gregory, de Geus, Moore, "Automating Logic Design with Socrates," Digital Design 44–46 (Oct. 1986).
Brayton, Rudell, Sangiovanni–Vincentelli, Wang, "Multi–Level Logic Optimization and The Rectangular Covering Problem," 1986 ICCAD, pp. 66–69 (1986).
Detjens, Gannot, Rudell, Sangiovanni–Vincentelli, Wang, "Technology Mapping in MIS," Proc. IEE Int'l Conf. on Computer–Aided Design, pp. 116–119 (1987).
Rudell, "Logic Synthesis for VLSI Design," Berkeley Technical Memorandum No. UCB/ERL M89/49 (Apr. 26, 1989).
Brayton, R.K., et al., "Logic Minimization Algorithms for VLSI Synthesis," (Kluwer 1985).
Sangiovanni–Vincent, Ili, A., "Synthesis of LSI Circuits," in Design Systems for VLSI Circuits ( d. De Micheli, G., et al.) (1987 Martinus Hijhom at pp. 1–13).
Walker, R., et al., "A Model of Design Representation and Synthesis," in Proceedings of 22 Design Automation Conference (1985) at 453–459.
Gajski, D., "Silicon Compilation," VLSI Systems Design (Nov. 1985) at pp. 48–64.
Mead, Conway, "Introduction to VLSI Systems," 1980.
Brayton, R.K., et al., "A Taxonomy of CAD for VLSI," Proceedings of the 1981 European Conf on Circuit Theory and Design, at 34–57.
Knapp, et al., "An Expert Synthesis System," Proceedings of the Int'l Conf. on Computer Aided Design (ICCAD) (1983) at pp. 419–424.
Orailoglu, et al., "Flow Graph Representation," Proceedings of the 22nd Design Automation Conference (1986) at pp. 503–509.
Pangrle, B., et al., "State Synthesis and Connectivity Binding for MicroArchitecture," in Proceedings of the ICCAD–86 at pp. 210–213.
Shiva, 5. 0., "Simulation attributes of computer hardware description languages," The Radio and Electronic Engineer, vol. 54 No. 1 (Jan. 1984) at pp. 45–50.
Expert Report of Dr. Thaddeus J. Kowalski (Case Nos. C03–04669 MJJ (EMC); C03–02889 MJJ (EMC)).
Expert Report of Tom M. Mitchell (Case Nos. C03–04669 MJJ (EMC); C03–02889 MJJ (EMC)).
Ricoh's Written Report of Donald Soderman in Rebuttal to Reports of Kowalski, Mitchell, and Van Horn (partially redacted) (Case Nos. C03–04669 MJJ (EMC); C03–02889 MJJ (EMC)).
de Geus, "Logic Synthesis Speeds ASIC Design", IEEE Spectrum, (1989) at 27–31.
Press Release, "Paradyne Japan to Set Up Joint Venture with U.S. Firm," Jul. 21, 1986.

T. J. Kowalkski, D.J. Geiger, W. H. Wolf, W. Fichtner, The VLSI Design Automation Assistant: From Algorithms to Silicon, IEEE Design & Test, pp. 33–43 (1985).
Thaddeus Julius Kowalski, The VLSI Design Automation Assistant: A Knowledge–Based Expert System, Carnegie–Mellon University PhD Thesis, Apr. 1984.
In re *Ricoh Company Ltd, Patent Litigation*, No. C 03–02289 JW (N.D. Cal. 2003), Oct. 23, 2009, Revised Claim Construction After Reconsideration.
De Geus et al.; "The Socrates Logic Synthesis and Optimization System"; GE Calma Company; pp. 4130–4156.
Semiconductor Research Corporation (SRC); 1984 SRC Annual Report; Cooperative Research (24 pages).
Semiconductor Research Corporation (SRC); 1985 SRC Annual Report; Cooperative Research (36 pages).
Semiconductor Research Corporation (SRC); 1986 SRC Annual Report; Cooperative Research (38 pages).
Lucic; "The Cooperative Invention of Technology"; Semiconductor Research Corporation (SRC) Newsletter; vol. 3; No. 9; Sep. 1985; pp. 1–8.
Kowalski; "A Dissertation Submitted to the Graduate School in Partial Fulfillment of the Requirements"; The VLSI Design Automation Assistant: A Knowledge–Based Expert System; Apr. 27, 1984; pp. 1–161.
Kowalski; "The VLSI Design Automation Assistant: From Algorithms to Silicon"; IEEE Design and Test; Aug. 1985; pp. 33–43.
Mitchell, T.M. et al., A Knowledge–Based Approach to Design, IEEE Trans. on Pattern Analysis and Machine Intelligence, vol. PAMI–7, No. 5, Sep. 1985, pp. 502–510.
Mitchell, T.M. et al., A Knowledge–Based Approach to Design, IEEE Workshop on Principles of Knowledge–Based Systems, Dec. 1984, pp. 27–34.
T.J. Kowalski, D.J. Geiger, W. H. Wolf, W. Fichtner, The VLSI Design Automation Assistant: From Algorithms to Silicon, IEEE Design & Test, pp. 33–43 (1985).
Thaddeus Julius Kowalski, The VLSI Design Automation Assistant: A Knowledge–Based Expert System, Carnegie–Mellon University PhD Thesis, Apr. 1984.
Parker, The CMU Design Automation System—An Example of Automated Data Path Design, Proceedings of the Design Automation Conference, 1979, pp. 73–80.
Hideaki Kobayashi, "A Knowledge–Based Approach to VLSI CAD," in AM–86 Conference Proceedings, Greenville, South Carolina (Nov. 1986), at pp. 1–10.
Vanhoof, Rabaey, De Man, "A Knowledge–Based CAD System for Synthesis of Multi–Processor Digital Signal Processing Chips," Proceedings of Intl Conference on Very Large Scale Integration, (1987) at pp. 73–88.
Brewer, Gajski, "Knowledge Based Control in Micro–Architecture Design," Proceedings of 25th Design Automation Conf. (1987) at pp. 203–209.
Wolf, "Mix–and–Match Prototyping Using Objects" Fast–Prototyping of VLSI (Saucier et al eds.) (1987) at pp. 117–126.
Brayton R., et al., "Multiple–Level Logic Optimization System," Proceedings of the ICCAD (1986) at pp. 356–359.
Keutzer, K. et al., "Timing Optimization in a Logic Synthesis System," in Logic & Architecture Synthesis for Silicon Compilers (1988) at pp. 13–25.
Kawato, N., et al., "Expert System for Function Diagram Development," Information Processing Society of Japan, 26th National Conference (1983) at pp. 971–972.
Mano, T. et al., "OCCAM To CMOS: Experimental Logic Design Support System," from Koomen, C.J. et al., Computer Hardware Description Languages and their Applications (Elsevier 1985) at pp. 381–390.
May, D., "OCCAM," SIGPLAN Notices, vol. 18, No. 4 (Apr. 1983) at pp. 69–79.
Paulin, P.G. et al. "Force–Directed Scheduling in Automatic Data Path Synthesis," in Proceedings of 24th Design Automation Conference (1986) at pp. 195–202.
Mentor Graphics, "Logic Synthesis" (1989).
Baitinger, Lipp, Mylnski, Reiss, MEGA—Ein Modulares Entwurfssystem fur Gate–Arrays (1986).
Zimmerman, G., "Computer Aided Synthesis of Digital Systems," in Proceedings of Fifth Int'l Conf. on Computer Hardware Description Languages and Their Applications (1981), at pp. 331–347.
Marwedel, P., "The Mimola Design System: A Design System Which Spans Several Levels," in Methodologies for Computer System Design (Giloi W., et al., eds.) (North Holland 1985) at pp. 223–237.
Kruger G., "Automatic Generation of Self–Test Programs—A New Feature of the MIMOLA Design System," from 23rd Design Automation Conference (1986) at pp. 378–384.
Takagi, S., "Design Method Based Logic Synthesis," Proceedings of Seventh Int'l Conference on Computer Hardware Description Languages and their Applications (1985) at 49–63.
Shiva, S. G., "Automatic Hardware Synthesis," Proceedings of the IEEE, vol. 71, No. 1 (Jan. 1983) at pp. 76–87.
Thomas D. E., "The Automatic Synthesis of Digital Systems," Proceedings of the IEEE, vol. 69 No. 10 (Oct. 1981) at 1200–1211.
Gajski, D., "Silicon Compilers and Expert Systems for VLSI," in Proceedings of 21 Design Automation Conf. (1984) at 86–87.
Parker, "Automated Synthesis of Digital Systems," IEEE Design & Test of Computers (Nov. 1984) at pp. 75–81.
Rosenstiel, W., et al., "Logic Synthesis," in Logic Design and Simulation (Horbst, E., ed.) (North Holland 1986) at pp. 31–52.
Fujita, T. et al., "Artificial Intelligent Approach to VLSI Design," in Design Methodologies (Goto, S., ed.) (North–Holland 1986) at 441–464.
Gilkinson, et al., "Automated Technology Mapping," IBM J. of Research & Development, vol. 28 (1984) at pp. 546–556.
Shiva, 5. 0., "Computer Hardware Description Languages—A Tutorial," Proceedings of the IEEE, vol. 67, No. 12 (Dec. 1979) at pp. 1605–1615.

* cited by examiner

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-20 is confirmed.

* * * * *